(12) United States Patent
Zhang et al.

(10) Patent No.: US 6,934,424 B2
(45) Date of Patent: Aug. 23, 2005

(54) E-FIELD-MODULATED BISTABLE MOLECULAR MECHANICAL DEVICE

(75) Inventors: Xiao-An Zhang, Sunnyvale, CA (US); Zhang Lin Zhou, Mountain View, CA (US); R. Stanley Williams, Redwood, CA (US); Kent D. Vincent, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 15 days.

(21) Appl. No.: 10/794,689

(22) Filed: Mar. 3, 2004

(65) Prior Publication Data

US 2004/0227605 A1 Nov. 18, 2004

Related U.S. Application Data

(63) Continuation-in-part of application No. 10/013,643, filed on Nov. 13, 2001, now Pat. No. 6,751,365, which is a continuation-in-part of application No. 09/898,799, filed on Jul. 3, 2001, which is a continuation-in-part of application No. 09/844,862, filed on Apr. 27, 2001, now Pat. No. 6,763,158, which is a continuation-in-part of application No. 09/823,195, filed on Mar. 29, 2001, which is a continuation-in-part of application No. 09/759,438, filed on Jan. 12, 2001, now Pat. No. 6,512,119, which is a continuation-in-part of application No. 09/738,793, filed on Dec. 14, 2000, now Pat. No. 6,663,797.

(51) Int. Cl.⁷ .............................................. G02F 1/035
(52) U.S. Cl. .................... 385/2; 385/1; 385/3
(58) Field of Search ............................. 385/1, 2, 3, 4, 385/5, 6, 7, 8, 9, 10

(56) References Cited

U.S. PATENT DOCUMENTS

5,781,330 A  *  7/1998  Kolodner et al. ........... 359/273

OTHER PUBLICATIONS

C.P Collier et al., "Electrically Configurable Molecular Based Logic Gated", Science, vol. 285, pp. 391–394 16 (Jul. 16, 1999).

C.P. Collier et al., "A (2) Catanae–Based Solid State Electronically Configurable Switch", Science, vol. 287, pp. 1172–1175 (Aug. 18, 2000).

(Continued)

*Primary Examiner*—Hung X. Dang

(57) ABSTRACT

A molecular system is provided for nanometer-scale reversible electronic and optical switches, specifically, electric field-activated molecular switches that have an electric field induced band gap change that occurs via rotation of rotor units connected to immobile stator units. The molecular system has two branches on one side of an immobile junction unit and one or two branches on the opposite side to thereby provide "Y" and "X" configurations, respectively. The ends of the branches opposite the junction unit are connected to, or electrically associated with, other molecular systems or substrates, such as electrodes. The rotor units each rotate between two states as a function of an externally-applied field. Both multi-stable molecular mechanical devices and electric field-activated optical switches are provided.

51 Claims, 5 Drawing Sheets

OTHER PUBLICATIONS

Yi Cui et al., "Doping and Electrical Transport in Silicon Nanowires", The Journal of Physical Chemistry B, vol. 104, No. 22, pp. 5213–5216 (Jun. 8, 2000).

Yi Cui et al., "Functional Nanoscale Electronic Devinces Assembled Using Silicon Nanowire Building Blocks", Science, vol. 291, pp. 851–853 (Feb. 2, 2001).

Yi Cui et al., "Nanowire Nosensors for Highly Sensitive and Selective Detection of Biological and Chemical Species", Science, vol. 293, pp. 1289–1292 (Aug. 12, 2001).

A.M. Morales et al., "A laser ablation method for the systhesis of crystalline semiconductor nanowires", Science, vol. 279, pp. 208–211 (Jan. 9, 1998).

J.R. Heath et al., "A liquid solution synthesis of single crystal germanium quantum wires", Chemical Physics Letters, vol. 208, pp. 263–268 (Jun. 11, 1993).

V.P. Menon et al., "Fabrication and Evaluation of Nano-–Electrode Ensembles", Analytical Chemistry, vol. 67, pp. 1920–1928 (Jul. 1, 1995).

T. Vossmeyer et al., "Combinatorial approaches toward patterning nanocrystals", Journal of Applied Physics, vol. 84, pp. 3664–3670 (Oct. 1, 1998).

D.V. Leff et al., "Thermodynamic Control of Gold Nanocrystal Sixe: Experiment and Theory", The Journal of Physical Chemistry, vol. 99, pp. 7036–7041 (1995).

J.D.L. Holloway et al., "Electro–transfer reactions of metallocenes: Influence of metal oxidation state of structure and reactivity", Journal of the American Chemical Society, vol. 101, pp. 2038–2044 (Apr. 11, 1979).

\* cited by examiner

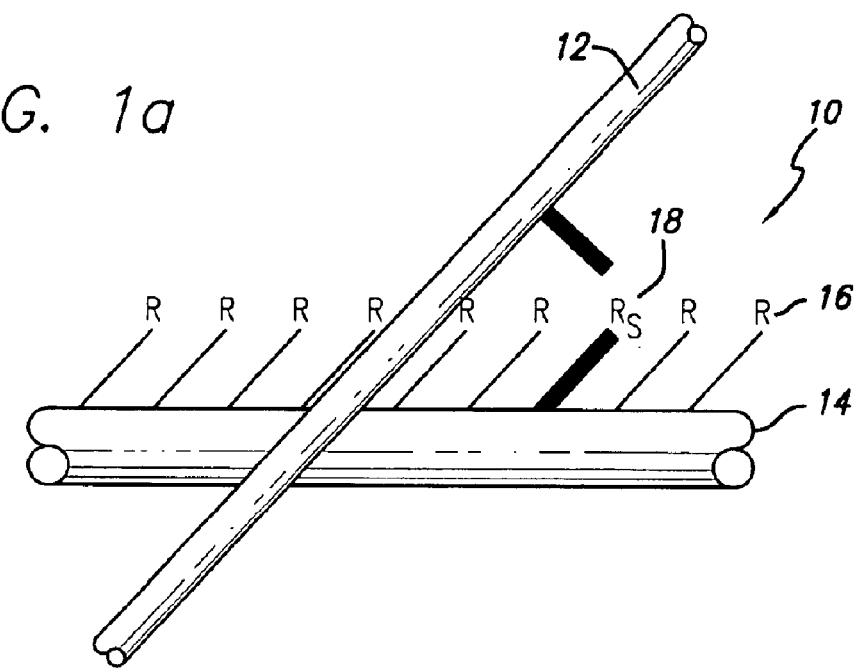
FIG. 1a
FIG. 1
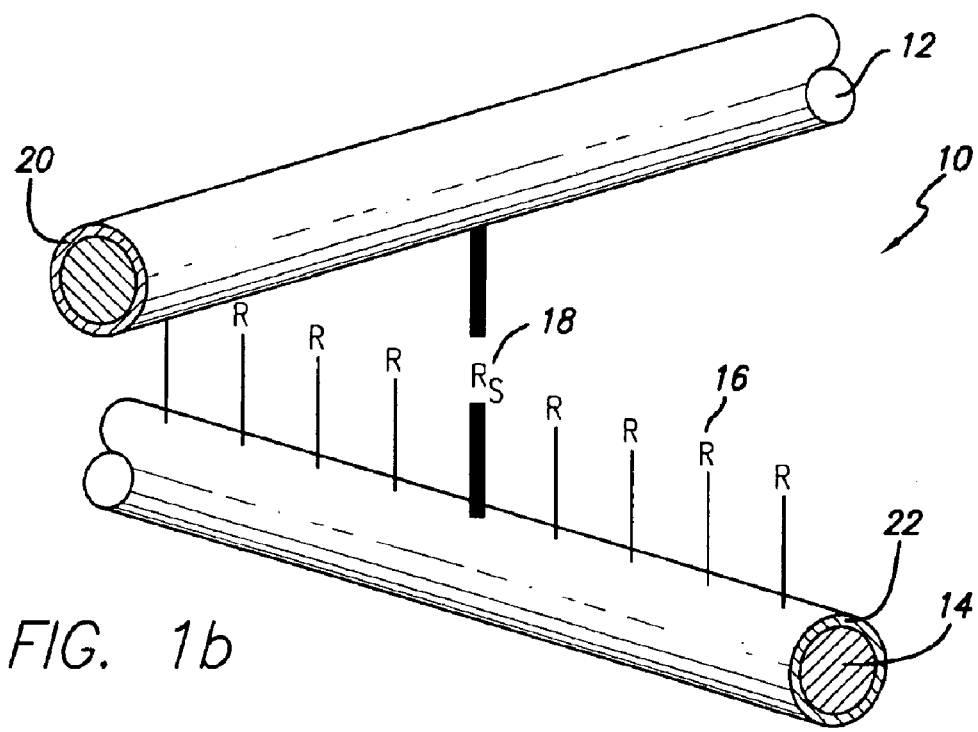
FIG. 1b

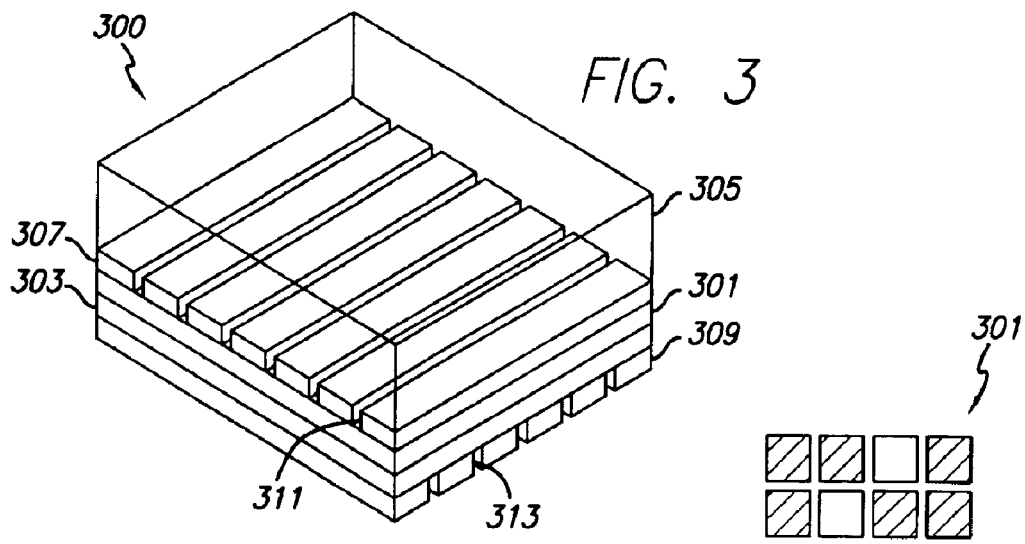
FIG. 3
FIG. 3a
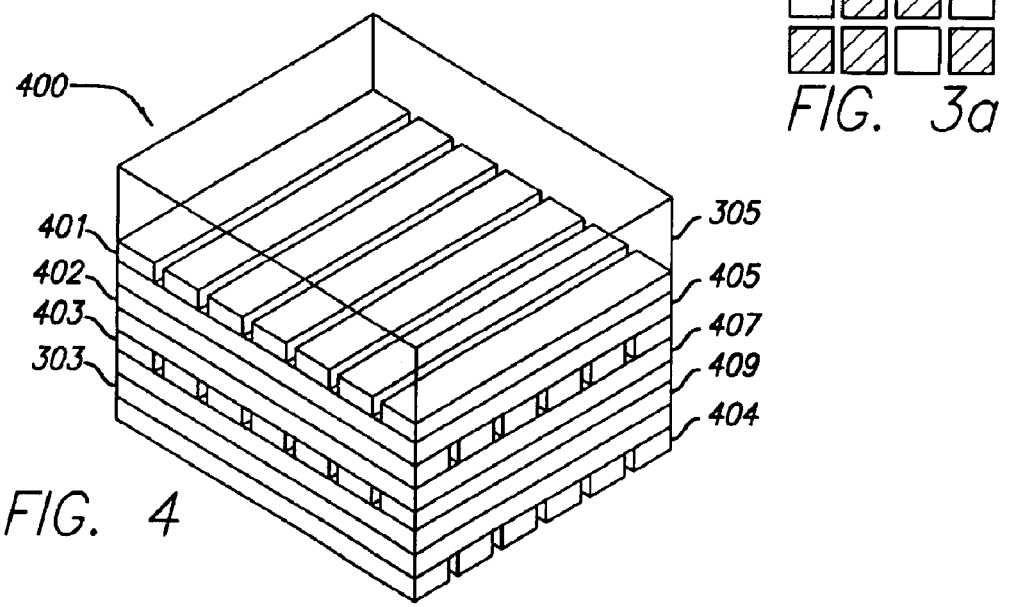
FIG. 4
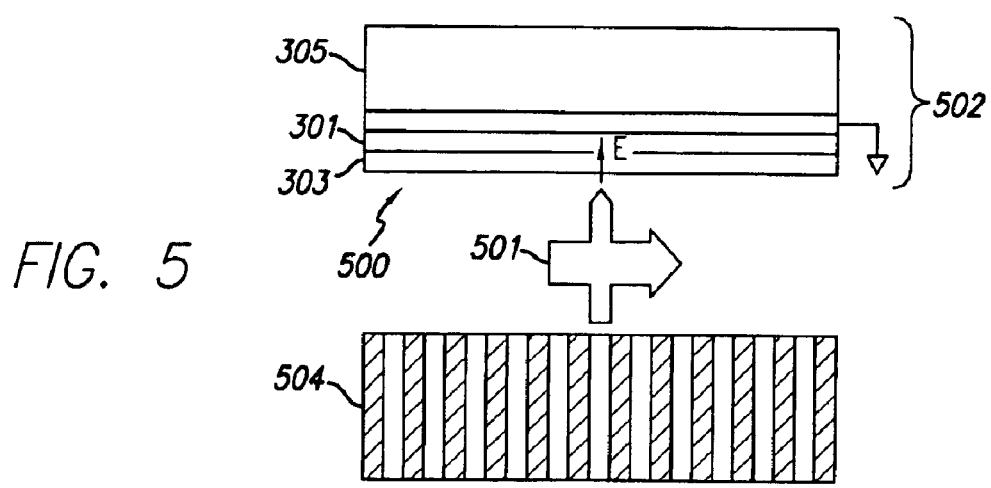
FIG. 5

E-FIELD-MODULATED BISTABLE MOLECULAR MECHANICAL DEVICE

CROSS-REFERENCE TO RELATED APPLICATIONS

The present application is a continuation-in-part of application Ser. No. 10/013,643, filed Nov. 13, 2001 now U.S. Pat. No. 6,751,365, which is a continuation-in-part application of application Ser. No. 09/898,799, filed Jul. 3, 2001 now pending, which is a continuation-in-part application of Ser. No. 09/844,862, filed Apr. 27, 2001 now U.S. Pat. No. 6,763,158, which in turn is a continuation-in-part application of Ser. No. 09/823,195, filed Mar. 29, 2001 now pending, which in turn is a continuation-in-part application of Ser. No. 09/759,438, filed Jan. 12, 2001, now U.S. Pat. No. 6,512,119, issued Jan. 28, 2003, which in turn is a continuation-in-part application of Ser. No. 09/738,793, filed Dec. 14, 2000, now U.S. Pat. No. 6,663,797, issued Dec. 16, 2003.

The present application is directed to a specific molecular system that involves at least two rotatable segments (rotors) that have a large dipole moment and that each link with two other portions of the molecule that are immobilized (stators). The molecular system disclosed herein provides switching from one state to a different state, characterized by a change in the electronic properties and/or the optical properties of the molecules.

TECHNICAL FIELD

The present invention relates generally to electronic and optical devices whose functional length scales are measured in nanometers, and, more particularly, to classes of molecules that provide electronic and optical switching. Electronic and optical devices both of micrometer and nanometer scale may be constructed in accordance with the teachings herein.

BACKGROUND ART

The area of molecular electronics is in its infancy. To date, there have been two convincing demonstrations of molecules as electronic switches published in the technical literature; see, C. P. Collier et al., Science, Vol. 285, pp. 391–394 (16 Jul. 1999) and C. P. Collier et al., Science, Vol. 289, pp. 1172–1175 (18 Aug. 2000), but there is a great deal of speculation and interest within the scientific community surrounding this topic. In the published work, a molecule called a rotaxane or a catenane was trapped between two metal electrodes and caused to switch from an ON state to an OFF state by the application of a positive bias across the molecule. The ON and OFF states differed in resistivity by about a factor of 100 and 5, respectively, for the rotaxane and catenane.

The primary problem with the rotaxane was that it is an irreversible switch. It could only be toggled once. Thus, it can be used in a programmable read-only memory (PROM), but not in a ROM-like device nor in a reconfigurable system, such as a defect-tolerant communications and logic network. In addition, the rotaxane requires an oxidation and/or reduction reaction to occur before the switch can be toggled. This requires the expenditure of a significant amount of energy to toggle the switch. In addition, the large and complex nature of rotaxanes and related compounds potentially makes the switching times of the molecules slow. The primary problems with the catenanes are small ON-to-OFF ratio and a slow switching time.

Thus, what is needed is a molecular system that avoids chemical oxidation and/or reduction, permits reasonably rapid switching from a first state to a second, is reversible to permit the fabrication of ROM-like devices, and can be used in a variety of electronic and/or optical devices.

DISCLOSURE OF INVENTION

In accordance with the present teachings, a molecular system having at least three branches is provided, with one end of each branch connected to an immobile junction unit, with two of the branches on one side of the junction unit and with at least one other branch on the opposite side of the junction unit, wherein either:

the molecular system comprises three branches, wherein the two branches each contain an immobile stator unit in its backbone, and the two branches each further contain at least one rotatable rotor unit in its backbone between the stator unit and the junction unit; or the molecular system comprises four branches, with two of the branches on one side of the junction unit and with two other branches on the opposite side thereof wherein each branch contains contain an immobile stator unit in its backbone, and each branch further contain at least one rotatable rotor unit in its backbone between the stator unit and the junction unit, wherein each rotor unit rotates between two states as a function of an externally-applied field.

Further in accordance with the present teachings, a multi-stable molecular mechanical device is provided, comprising a molecular system configured within an electric field generated by a pair of electrodes and electrically connected thereto. The molecular system is as described above, wherein each rotor portion rotates with respect to its associated stator portions between at least two different states upon application of the electric field, thereby inducing a band gap change in the molecular system, wherein in a first state, there is extended conjugation over at least most of the molecular system, resulting in a relatively smaller band gap, and wherein in a second state, the extended conjugation is changed, resulting in a relatively larger band gap, and wherein in intermediate states, the conjugation is intermediate between that of the first state and that of the second state.

Still further in accordance with the teachings herein, an electric field-activated optical switch is provided, comprising a molecular system configured within an electric field generated by a pair of electrodes. The molecular system is as described above, wherein each rotor portion rotates with respect to its associated stator portions between at least two different states upon application of the electric field, thereby inducing a band gap change in the molecular system, wherein in a first state, there is extended conjugation over at least most of the molecular system, resulting in a relatively smaller band gap, wherein in a second state, the extended conjugation is changed, resulting in a relatively larger band gap, and wherein in an intermediate state, the conjugation is intermediate between that of the first state and that of the second state.

BRIEF DESCRIPTION OF THE DRAWINGS

FIG. 1a is a schematic representation of two crossed wires, with at least one molecule at the intersection of the two wires;

FIG. 1b is a perspective elevational view, depicting the device shown in FIG. 1a;

FIG. 3 is a schematic representation (perspective, transparent view) of a two color (e.g., black and white) display screen construction for use in accordance with the present invention;

FIG. 3a is a detail for a colorant layer element of the display screen depicted in FIG. 3;

FIG. 4 is a schematic representation (perspective, transparent view) of a full-color display screen construction for use in accordance with the present invention;

FIG. 5 is a schematic representation of a scan addressing embodiment of a two-color display screen construction for use in accordance with the present invention;

BEST MODES FOR CARRYING OUT THE INVENTION

Figure 2:
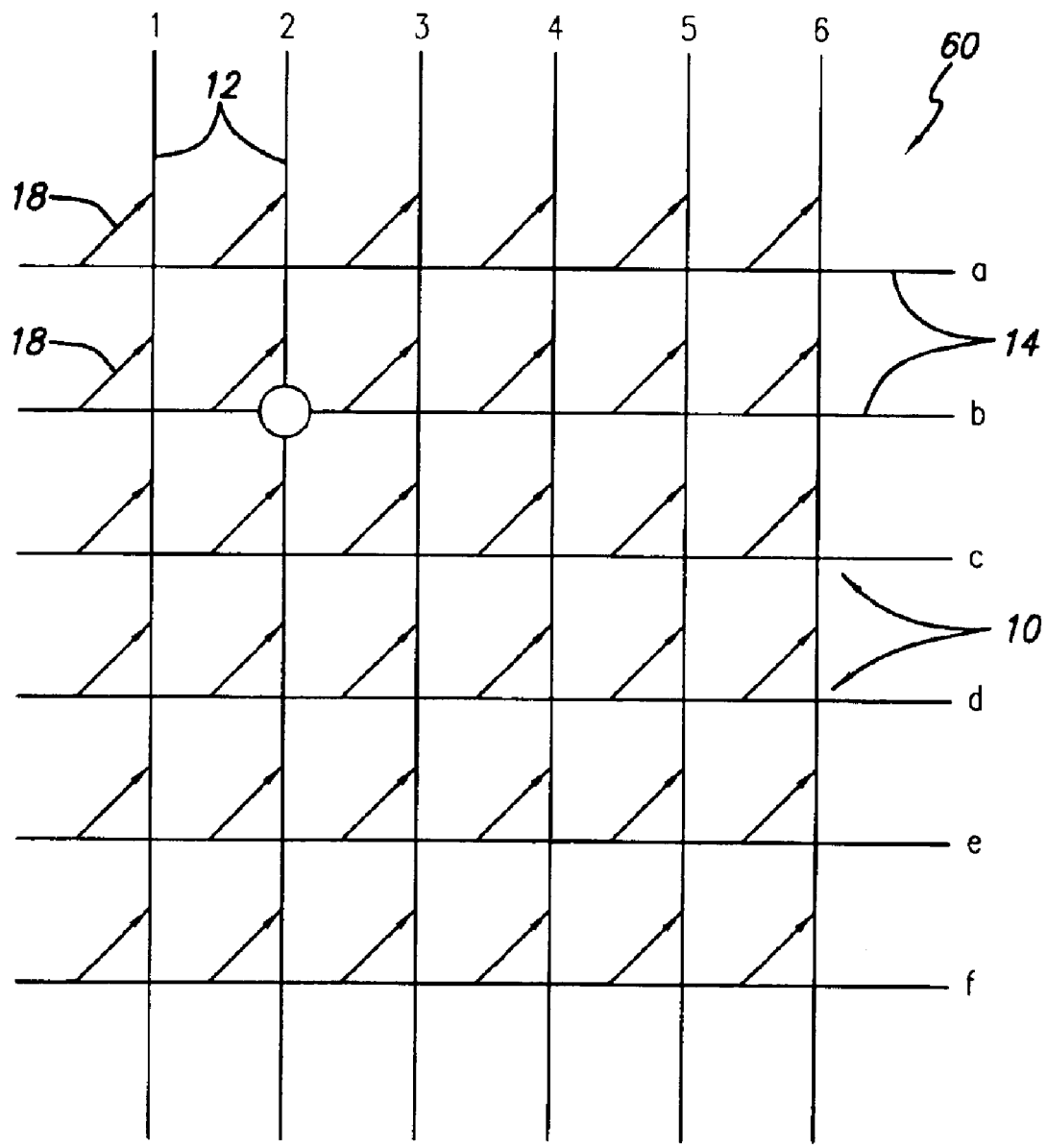
FIG. 2 is a schematic representation of a two-dimensional array of switches of the present invention, depicting a 6×6 crossbar switch.

Definitions:

The term "self-assembled" as used herein refers to a system that naturally adopts some geometric pattern because of the identity of the components of the system; the system achieves at least a local minimum in its energy by adopting this configuration.

The term "singly configurable" means that a switch can change its state only once via an irreversible process such as an oxidation or reduction reaction; such a switch can be the basis of a programmable read-only memory (PROM), for example.

The term "reconfigurable" means that a switch can change its state multiple times via a reversible process such as an oxidation or reduction; in other words, the switch can be opened and closed multiple times, such as the memory bits in a random access memory (RAM) or a color pixel in a display.

The term "bi-stable" as applied to a molecule means a molecule having two relatively low energy states separated by an energy (or activation) barrier. The molecule may be either irreversibly switched from one state to the other (singly configurable) or reversibly switched from one state to the other (reconfigurable).

Micron-scale dimensions refers to dimensions that range from 1 micrometer to a few micrometers in size.

Sub-micron scale dimensions refers to dimensions that range from 1 micrometer down to 0.05 micrometers.

Nanometer scale dimensions refers to dimensions that range from 0.1 nanometers to 50 nanometers (0.05 micrometers).

Micron-scale and submicron-scale wires refers to rod or ribbon-shaped conductors or semiconductors with widths or diameters having the dimensions of 0.05 to 10 micrometers, heights that can range from a few tens of nanometers to a micrometer, and lengths of several micrometers and longer.

"HOMO" is the common chemical acronym for "highest occupied molecular orbital", while "LUMO" is the common chemical acronym for "lowest unoccupied molecular orbital". HOMOs and LUMOs are responsible for electronic conduction in molecules and the energy difference between the HOMO and LUMO and other energetically nearby molecular orbitals is responsible for the color of the molecule.

An optical switch, in the context of the present invention, involves changes in the electro-magnetic properties of the molecules, both within and outside that detectable by the human eye, e.g., ranging from the far infra-red (IR) to deep ultraviolet (UV). Optical switching includes changes in properties such as absorption, reflection, refraction, diffraction, and diffuse scattering of electromagnetic radiation.

The term "transparency" is defined within the visible spectrum to mean that optically, light passing through the colorant is not impeded or altered except in the region in which the colorant spectrally absorbs. For example, if the molecular colorant does not absorb in the visible spectrum, then the colorant will appear to have water clear transparency.

The term "omni-ambient illumination viewability" is defined herein as the viewability under any ambient illumination condition to which the eye is responsive.

Basic Information on Prior Art Crossed Wire Switches:

The essential device features are shown in FIGS. 1a–1b and are discussed in greater detail in the above-related patent applications and patent. A crossed wire switch 10 comprises two wires 12, 14, each either a metal or semiconductor wire, that are crossed at some non-zero angle. In between those wires is a layer of molecules or molecular compounds 16, denoted R in FIGS. 1a and 1b. The particular molecules 18 (denoted $R_s$) that are sandwiched at the intersection of the two wires 12, 14 are identified as switch molecules, also interchangeable referred to herein as a junction. When an appropriate voltage is applied across the wires, the switch molecules are either oxidized or reduced. When a molecule is oxidized (reduced), then a second species is reduced (oxidized) so that charge is balanced. These two species are then called a redox pair. One example of this device would be for one molecule to be reduced, and then a second molecule (the other half of the redox pair) is oxidized. In another example, a molecule is reduced, and one of the wires is oxidized. In a third example, a molecule is oxidized, and one of the wires is reduced. In a fourth example, one wire is oxidized, and an oxide associated with the other wire is reduced. In all cases, oxidation or reduction will affect the tunneling distance or the tunneling barrier height between the two wires, thereby exponentially altering the rate of charge transport across the wire junction, and serving as the basis for a switch.

The electrical tasks performed by these devices are largely determined by the types of wires (electrodes) and the interwire materials that are used. Table I presents the various types of devices that might be fabricated from various combinations of the wires 12, 14 in FIGS. 1a–1b.

TABLE I

| | Wire (Electrode) Materials | | | | |
|---|---|---|---|---|---|
| Device Type | Metal-metal (same) | Metal-metal (different) | Metal-semiconductor | Semiconductor-Semiconductor (p-n junction) | Semiconductor-semiconductor (heterojunction) |
| Resistor | X | X | X | | |
| Tunneling resistor | X | X | X | | |
| Resonant tunneling resistor | X | X | X | | |
| Diode | | X | X | X | X |

TABLE I-continued

Wire (Electrode) Materials

| Device Type | Metal-metal (same) | Metal-metal (different) | Metal-semiconductor | Semiconductor-Semiconductor (p-n junction) | Semiconductor-semiconductor (heterojunction) |
|---|---|---|---|---|---|
| Tunneling diode | X | X | X | | X |
| Resonant tunneling diode | X | X | X | | X |
| Battery | X | X | | X | |

Depending on the molecules or materials that are used between the wires (the electrodes), each junction can either display the types of electrical function described below immediately on contact of the wires or the junction can have a switching function that acts to connect or disconnect the two wires together electrically. This switch can either be singly configurable or reconfigurable. In the first case, the initial state of the switch is open or closed. In the second case, by cycling the polarity and magnitude of the voltage on the switch beyond the appropriate threshold values, it is possible to reversibly oxidize or reduce the properly selected materials or molecules to close or open the switch many times. In either case, when closed, the type of electrical connection that is made between the wires depends upon the materials from which the wires (or electrodes) are fabricated as well as the identity of the molecules or materials between the wires.

Table I above shows a matrix of the various types of functions that can be obtained from various combinations of electrode materials and materials or molecules used in the junction. A resistor has a linear current-voltage characteristic, and is made by intentionally over-reducing the junction between various types of wires to essentially form a short circuit between the wires. The opposite of this process is to over-oxidize a junction, which will consume the wire in a localized region and effectively break the wire (create an open circuit) in that wire at the position of the junction. A tunneling resistor maintains a thin, approximately 2 nanometer thick, insulating barrier between wires and has an exponential current-voltage characteristic. In the case that junction molecules or materials have a sharply defined energy state inside the band gap of an electrically insulating barrier that can be accessed by electrically biasing the junction, the connection between the wires can exhibit a flow of electrical current that is dominated by the process of resonant tunneling. The resonant tunneling can produce one or more inflection points in the otherwise exponential current-voltage characteristic of a tunneling resistor. A diode is a junction that passes current more easily in one direction than in the other, and thus has an asymmetry in the current-voltage characteristic for positive and negative voltages. A tunneling diode has both the positive-negative voltage asymmetry of the diode and the exponential current-voltage characteristic of the tunneling resistor. A resonant tunneling diode has a positive-negative voltage asymmetry plus it has a peak in its current-voltage characteristic, such that over a restricted range of increasing magnitude of the voltage the magnitude of the current actually decreases, a phenomenon that is known as negative differential resistivity. In general, any real junction between wires formed by the processes described above will actually have two or more of the electrical functions described, with the effective circuit elements connected in series.

Thus, the present invention may be executed with any number of metallic or semiconducting wire/molecule combinations, depending on the device properties desired from the assembled circuit.

Basic Information on Prior Art Fabrication of Wire Electrodes

Process-Defined Wires (defined as wires that are prepared by conventional electronic-circuit processing techniques; wires are typically prepared on a substrate as part of a circuit):

Metallic and semiconductor wires, with diameters ranging from several micrometers to a single micrometer (defined as micrometer-scale), or with diameters ranging from a single micrometer down to 40 nanometers (defined as sub-micrometer scale) in diameter, may be prepared using well-established art, including lithographic (optical, ultraviolet, or electron beam) technologies. These wires normally have a ribbon shape or rectangular cross section, although circular cross sections are not precluded, with the width of the wire being determined by the lithographic process used to define the wire and its height being defined by the amount of material deposited in the region defined by lithography.

Chemically-Prepared Wires (these wires are prepared by techniques other than conventional electronic processing technology; wires are typically prepared as a bulk material, rather than as part of a circuit board):

Metal and semiconductor nanowires are defined as wires with diameters below 50 nanometers (typically 2 to 20 nanometers), and with lengths in the range of 0.1 micrometers to 50 micrometers (typically 5 to 10 micrometers). These may be prepared chemically using any one of a number of techniques described in the references given below.

One example of a reported technique for the production of semiconductor nanowires of the semiconducting element germanium is to react germanium tetrachloride and phenyl germanium(IV) chloride with a dispersion of sodium metal in the solvent toluene, and at a temperature near 300° C. in a closed vessel, under an inert environment, for a period of several days. That preparation produces single-crystal germanium nanowires of diameters three to thirty nanometers, and of lengths from 0.5 to 10 micrometers.

A second example of a reported technique for the production of semiconductor nanowires of the semiconducting element silicon, is to laser vaporize a target containing elemental silicon and iron. The target is placed in a vacuum oven at 1300° C., and an inert gas is flowed through the oven during the vaporization process. This technique produces silicon wires that have diameters in the range of 20 to 30 nanometers, and lengths ranging from 1 to 20 micrometers.

One example of a reported technique for the production of metallic nanowires of the metallic element gold is to electrochemically grow gold wires within the pores of an anodically etched aluminum oxide thin film. The aluminum oxide is dissolved in acidic solution, releasing the gold nanowires, which are then collected. Gold nanowires grown in this manner are characterized by diameters ranging from 20 to 30 nanometers, and lengths ranging from 0.5 to 5 micrometers.

Nanowires of various metallic and semiconducting materials may be prepared in a variety of fashions. Some of these devices will require doped semiconductor wires, such as doped Si.

For the case of Si wires, the wires can be doped when the wires are physically prepared. In this case, it is necessary to add the dopant into the reaction vessel as the wires are formed. For example, in the laser ablation/vacuum oven preparation technique described above, a small amount of dopant gas, such as phosphine ($PH_3$) or arsenic(III) hydride ($AsH_3$) is added into the inert gas (argon, for example) that flows through the vacuum oven during the laser ablation/wire formation process.

Conversely, these wires can be modulation-doped by coating their surfaces with appropriate molecules—either electron-withdrawing groups (Lewis acids, such as boron trifluoride ($BF_3$)) or electron-donating groups (Lewis bases, such as alkyl amines) to make them p-type or n-type conductors, respectively. See wire preparation routes listed below. FIG. 1b depicts a coating 20 on wire 12 and a coating 22 on wire 14. The coatings 20, 22 may be modulation-doping coatings, tunneling barriers (e.g., oxides), or other nano-scale functionally suitable materials. Alternatively, the wires 12, 14 themselves may be coated with one or more R species 16, and where the wires cross, $R_s$ 18 is formed. Or yet alternatively, the wires 12, 14 may be coated with molecular species 20, 22, respectively, for example, that enable one or both wires to be suspended to form colloidal suspensions, as discussed below.

To dope the wires via modulation doping, it is necessary to chemically functionalize the surface of the wires using organic or inorganic molecules that will covalently bind to the Si—O—H groups at the surface of the wires. When silicon nanowires are exposed to air, a thin surface layer (1 nm) of $SiO_2$ will naturally form, and at the $SiO_2$/air interface, the $SiO_2$ surface is terminated by Si—O—H bonds. Groups that will bind to or replace Si—O—H groups are not limited to but include R—Si($CH_3$)$_x$(O$CH_{3-x}$), R—Si($CH_3$)$_x$(O$CH_2CH_{3-x}$), R—Si($CH_3$)$_x$Cl$_{3-x}$, and others. In this case, R represents an organic or inorganic moiety that can contain electron-withdrawing (a Lewis acid) or electron-donating groups (a Lewis base). This chemistry of binding molecules to a $SiO_2$ passivated silicon surface is well established. One published example reaction for binding molecules to the surface of $SiO_2$ passivated silicon is:

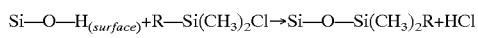
Si—O—H$_{(surface)}$+R—Si($CH_3$)$_2$Cl→Si—O—Si($CH_3$)$_2$R+HCl

Other semiconductor wires can be functionalized with organoamines, organo-thiols, organo-phosphates, etc.

Semiconductor nanowires have been modulation-doped (i.e., as indicated by a change in conductivity of silicon nanowires when compounds adsorb on the wires); see, e.g., Yi Cui et al, "Doping and Electrical Transport in Silicon Nanowires", The Journal of Physical Chemistry B, Vol. 104, No. 22, pp. 5213–5216 (Jun. 8, 2000); Yi Cui et al, "Functional Nanoscale Electronic Devices Assembled Using Silicon Nanowire Building Blocks", Science, Vol. 291, pp. 851–852 (2 Feb. 2001); and Yi Cui et al, "Nanowire Nanosensors for Highly Sensitive and Selective Detection of Biological and Chemical Species", Science, Vol. 293, pp. 1289–1292 (17 Aug. 2001).

For the case of other nanowires, such as metal nanowires, the wires can be chemically functionalized with R—SH (for gold or silver wires), or R—$NH_2$ (for platinum wires and palladium wires), or R—$CO_2H$ for other metals such as $Al_2O_3$-coated aluminum wires or titanium wires), where the R-group denotes some organic moiety that will lend the wire certain chemical properties—such as the property that will allow the person skilled in the art to disperse the wires, as a colloid, in a solvent. In one example, gold wires might be functionalized with dodecanethiol ($C_{12}H_{25}SH$). The dodecanethiol not only will provide the wires with a thin surface tunneling barrier, but will also allow for the wires to be dispersed in simple organic solvents, such as hexane or chloroform.

Basic Information on Prior Art Wire Preparation Routes

The following materials may be prepared as nanowires according to the reference listed.

Silicon: A. M. Morales et al, "A laser ablation method for the synthesis of crystalline semiconductor nanowires", Science, Vol. 279, pp. 208–211 (Jan. 9, 1998).

Germanium: J. R. Heath et al, "A liquid solution synthesis of single crystal germanium quantum wires", Chemical Physics Letters, Vol. 208, pp. 263–268 (Jun. 11, 1993).

Metal Nanowires: V. P. Menon et al, "Fabrication and Evaluation of Nano-electrode Ensembles", Analytical Chemistry, Vol. 67, pp. 1920–1928 (Jul. 1, 1995).

Functionalizing Silicon: T. Vossmeyer et al, "Combinatorial approaches toward patterning nanocrystals", Journal of Applied Physics, Vol. 84, pp. 3664–3670 (Oct. 1, 1998) (one of a number of references).

Functionalizing the Surfaces of Gold Nanostructures: D. V. Leff et al, "Thermodynamic Size Control of Au Nanocrystals: Experiment and Theory", The Journal of Physical Chemistry, Vol. 99, p. 7036–7041 (May 4, 1995).

Molecular switching components may come from any number of different classes of molecules, depending, again, on the desired properties of the device. The key requirement of the molecules is that, when they are sandwiched between two wires, they may be electrochemically modified (i.e. oxidized or reduced) by applying a voltage across the wires. When the molecular components are so modified, the net effect is that the tunneling barrier between the two wires is modified, and the rate of current flow is changed. This forms the basis of a switch that can, in turn, be used for memory, logic operations, and communication and signal routing networks. Molecular switches can include redox pairs of molecules, in which application of a voltage reduces one of the molecules and oxidizes the other. An example of such a molecular redox pair might be: nickelocene (dicyclopentadienyl nickel), or $Cp_2Ni$, with tetrabutyl ammonium hexafluorophosphate ($Bu_4NPF_6$). The reaction, then, would be:

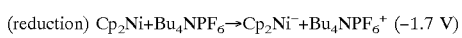
(reduction) $Cp_2Ni+Bu_4NPF_6 \rightarrow Cp_2Ni^- + Bu_4NPF_6^+$ (−1.7 V)

or

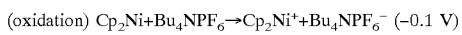
(oxidation) $Cp_2Ni+Bu_4NPF_6 \rightarrow Cp_2Ni^+ + Bu_4NPF_6^-$ (−0.1 V)

The nickelocene system is of particular interest in that the reduction, as probed by solution phase cyclic voltammetry, is highly asymmetric. Such asymmetry is analogous to magnetization hysteresis curves that form the basis for stable and rewriteable magnetic memory. However, in the presence of oxygen, the reduction of nickelocene is irreversible, as probed by solution phase voltammetry. In either case, reduction or oxidation of this system will modify the tunneling barrier between the two wires between which the molecules are sandwiched. Thus, this system could operate as either a reconfigurable, or a singly configurable molecular switch. For metallocene systems, see, e.g., J. D. L. Holloway et al, "Electron-transfer reactions of metallocenes: Influence of metal oxidation state on structure and reactivity", Journal of the American Chemical Society, Vol. 101, pp. 2038–2044 (Apr. 11, 1979).

The connector species 16 comprises a material that displays a significant, or measurable, hysteresis in its current-voltage curve, obtained either from solution electrochemistry or from current-voltage characteristics in a solid-state junction. Examples of such species include metallocenes, rotaxanes, pseudo-rotaxanes, and catenanes, which rely on intramolecular hydrogen bonding. While such molecules are useful for the purpose disclosed, however, simple intramolecular hydrogen bonding forces are relatively easily exceeded under certain conditions, as discussed above.

As illustrated in FIG. 2, the switch 10 can be replicated in a two-dimensional array to form a plurality, or array, 60 of switches to form a crossbar switch. FIG. 2 depicts a 6×6 array 60, but the invention is not so limited to the particular number of elements, or switches, in the array. Access to a single point, e.g., 2b, is done by impressing voltage on wires 2 and b to cause a change in the state of the molecular species 18 at the junction thereof, as described above. Thus, access to each junction is readily available for configuring only those pre-selected junctions in accordance with the teachings herein. Details of the operation of the crossbar switch array 60 are further discussed in above-referenced U.S. Pat. No. 6,128,214.

Optical Switches

Optical switches are described in greater detail in co-pending U.S. application Ser. No. 09/981,166, filed on Oct. 16, 2001. A generic example taken from that application is depicted herein in FIG. 3, wherein a display screen 300 is shown that incorporates at least one colorant layer 301. The colorant layer 301 comprises a pixel array using electrical field switchable, reconfigurable, dye or pigment molecules of the present invention, described in greater detail below and generically referred to as a "molecular colorant". Each dye or pigment molecule is field switchable either between an image color (e.g., black) and transparent or between two different colors (e.g., red and green).

Referring briefly to FIG. 3a, the colorant layer 301 is an addressable pixel array formed of bi-stable molecules arrayed such that a selected set of molecules correlates to one pixel. The colorant layer 301 is a thin layer coated on a background substrate 303 having the display's intended background color (e.g., white). The substrate 303 may comprise, for example, a high dielectric pigment (e.g., titania) in a polymer binder that provides good white color and opacity while also minimizing the voltage drop across the layer. The stratified combination of colorant layer 301 and substrate 303 thus is fully analogous to a layer of ink on paper. In a blank mode, or erased state, each molecule is switched to its transparent orientation; the "layer of ink" is invisible. The background (e.g., white pixels) shows through in those pixel areas where the colorant layer 301 molecules are switched to the transparent orientation. A transparent view-through layer 305, such as of a clear plastic or glass, is provided superjacent to the colorant-background sandwich to provide appropriate protection. The view-through layer 305 has a transparent electrode array 307 for pixel column or row activation mounted thereto and positioned superjacently to the colorant layer 301. The background substrate 303 has a complementary electrode array 309 for pixel row or column activation mounted thereto (it will be recognized by those skilled in the art that a specific implementation of the stratification of the electrode arrays 307, 309 for matrix addressing and field writing of the individual pixels may vary in accordance with conventional electrical engineering practices). Optionally, the pixels are sandwiched by employing thin film transistor (TFT) driver technology as would be known in the art.

The present display 300 is capable of the same contrast and color as hard copy print. A molecular colorant is ideal because its size and mass are infinitesimally small, allowing resolution and colorant switching times that are limited only by the field writing electrodes and circuitry. Like ink, the colorant layer 301 may develop adequate density in a sub-micron to micron thin layer, potentially lowering the field voltage required to switch the colorant between logic states and thus allowing the use of inexpensive drive circuitry.

Suitable reconfigurable bi-stable and multi-stable molecules for use in such displays are disclosed below and claimed herein. In the main, these molecules have optical properties (e.g., color) that are determined by the extent of their $\pi$ orbital electron conjugation. The optical properties, including color or transparency, of the molecule change with field polarity applied across the molecule and remains chromatically stable in the absence of an applied electric field. By disrupting the continuity of conjugation across a molecule, the molecule may be changed from one optical state to another, e.g., colored to transparent or one color to another color. Electric dipoles may be designed into the colorant that can physically cause this disruption by rotating or otherwise distorting certain segments of the dye or pigment molecule relative to other segments, when an external electric field is applied or changed.

The colorant layer 301 is a homogeneous layer of molecules which are preferably colored (e.g., black, cyan, magenta, or yellow) in a more-conjugated orientation and transparent in a less-conjugated orientation. By making the abutting background substrate 303 white, the colorant layer 301 may thereby produce high contrast black and white, and colored images. The colorant layer 301 may comprise a single field switchable dye or pigment or may comprise a mixture of different switchable dyes or pigments that collectively produce a composite color (e.g., black). By using a molecular colorant, the resolution of the produced image is limited only by the electric field resolution produced by the electrode array 307, 309. The molecular colorant additionally has virtually instantaneous switching speed, beneficial to the needs of fast scanning (as described with respect to FIG. 5 hereinafter). In certain cases, the molecular colorant may be contained in a polymeric layer. Polymers for producing such coatings are well known, and include, for example, acrylates, urethanes, and the like. Alternatively, the colorant layer 301 may be self-assembled.

In one embodiment, the colorant layer 301 is offered as a substitute for matrix-addressed liquid crystal flat panel displays. As is well known for such displays, each pixel is addressed through rows and columns of fixed-position electrode arrays, e.g., 307, 309. The fixed-position electrode arrays 307, 309 consist of conventional crossbar electrodes 311, 313 that sandwich the colorant layer 301 to form an overlapping grid (matrix) of pixels, each pixel being addressed at the point of electrode overlap. The crossbar electrodes 311, 313 comprise parallel, spaced electrode lines arranged in electrode rows and columns, where the row and column electrodes are separated on opposing sides of the colorant layer 301. Preferably, a first set of transparent crossbar electrodes 307 (401, 402 in FIG. 4 described in detail hereinafter) is formed by thin film deposition of indium tin oxide (ITO) on a transparent substrate (e.g., glass). These row addressable pixel crossbar electrodes 307 are formed in the ITO layer using conventional thin film patterning and etching techniques. The colorant layer 301 and background substrate 303 are sequentially coated over or mounted to the transparent electrode layer, using conventional thin film techniques (e.g., vapor deposition) or thick film techniques (e.g., silkscreen, spin cast, or the like). Additional coating techniques include Langmuir-Blodgett deposition and self-assembled monolayers. Column addressable pixel crossbar electrodes 309 (402, 404 in FIG. 4) are preferably constructed in like manner to the row electrodes 307. The column addressable pixel crossbar electrodes 309 may optionally be constructed on a separate substrate that is subsequently adhered to the white coating using conventional techniques.

This display 300, 400 provides print-on-paper-like contrast, color, viewing angle, and omni-ambient illumination viewability by elimination of the polarization layers required for known liquid crystal colorants. Using the described-display also allows a significant reduction in power drain. Whereas liquid crystals require a holding field even for a static image, the present molecules of the colorant layer 301 can be modal in the absence of a field when bi-stable molecules are used. Thus, the present bi-stable colorant layer 301 only requires a field when a pixel is changed and only for that pixel. The power and image quality improvements will provide significant benefit in battery life and display readability, under a wider range of viewing and illumination conditions for appliances (e.g., wristwatches, calculators, cell phones, or other mobile electronic applications) television monitors and computer displays. Furthermore, the colorant layer may comprise a mosaic of colored pixels using an array of bi-stable color molecules of various colors for lower resolution color displays.

Since each colorant molecule in colorant layer 301 is transparent outside of the colorant absorption band, then multiple colorant layers may be superimposed and separately addressed to produce higher resolution color displays than currently available. FIG. 4 is a schematic illustration of this second embodiment. A high resolution, full color, matrix addressable, display screen 400 comprises alternating layers of transparent electrodes—row electrodes 401, 403 and column electrodes 402 and 404—and a plurality of colorant layers 405, 407, 409, each having a different color molecule array. Since each pixel in each colorant layer may be colored or transparent, the color of a given pixel may be made from any one or a combination of the color layers (e.g., cyan, magenta, yellow, black) at the full address resolution of the display. When all colorant layers 405, 407, 409 for a pixel are made transparent, then the pixel shows the background substrate 303 (e.g., white). Such a display offers the benefit of three or more times resolution over present matrix LCD devices having the same pixel density but that rely on single layer mosaic color. Details of the fabrication of the display are set forth in the above-mentioned co-pending application.

The color to be set for each pixel is addressed by applying a voltage across the electrodes directly adjacent to the selected color layer. For example, assuming yellow is the uppermost colorant layer 405, magenta is the next colorant layer 407, and cyan is the third colorant layer 409, then pixels in the yellow layer are addressed through row electrodes 401 and column electrodes 402, magenta through column electrodes 402 and row electrodes 403, and cyan through row electrodes 403 and column electrodes 404. This simple common electrode-addressing scheme is made possible because each colorant molecule is color stable in the absence of an applied electric field.

FIG. 5 depicts a third embodiment, which employs scan-addressing rather than matrix-addressing. Matrix address displays are presently limited in resolution by the number of address lines and spaces that may be patterned over the relatively large two-dimensional surface of a display, each line connecting pixel row or column to the outer edge of the display area. In this third embodiment, the bi-stable molecular colorant layer 301 and background substrate 303 layer construction is combined with a scanning electrode array printhead to provide a scanning electrode display apparatus 500 having the same readability benefits as the first two embodiments described above, with the addition of commercial publishing resolution. Scanning electrode arrays and drive electronics are common to electrostatic printers and their constructions and interfaces are well-known. Basically, remembering that the bi-stable molecular switch does not require a holding field, the scanning electrode array display apparatus 500 changes a displayed image by printing a pixel row at a time. The scanning electrode array display apparatus 500 thus provides far greater resolution by virtue of the ability to alternate odd and even electrode address lines along opposing sides of the array, to include multiple address layers with pass-through array connections and to stagger multiple arrays that proportionately superimpose during a scan. The colorant layer 301 may again be patterned with a color mosaic to produce an exceptionally high resolution scanning color display.

More specifically, the third embodiment as shown in FIG. 5 comprises a display screen 502, a scanned electrode array 504, and array translation mechanism 501 to accurately move the electrode array across the surface of the screen. The display screen 502 again comprises a background substrate 303, a transparent view-through layer 305, and at least one bi-stable molecule colorant layer 301. The colorant layer 301 may include a homogeneous monochrome colorant (e.g., black) or color mosaic, as described herein above. The scanned electrode array 504 comprises a linear array or equivalent staggered array of electrodes in contact or near contact with the background substrate 303. A staggered array of electrodes may be used, for example, to minimize field crosstalk between otherwise adjacent electrodes and to increase display resolution.

In operation, each electrode is sized, positioned, and electrically addressed to provide an appropriate electric field, represented by the arrow labeled "E", across the colorant layer 301 at a given pixel location along a pixel column. The field E may be oriented perpendicular to the plane of the colorant layer 301 or parallel to it, depending on the color switching axis of the colorant molecules. A perpendicular field may be produced by placing a common electrode (e.g., an ITO layer) on the opposing coating side to the electrode array. The electrode array may also be constructed to emit fringe fields; a parallel fringe field may be produced by placing a common electrode adjacent and parallel to the array. A perpendicular fringe field may be produced by placing symmetrically spaced parallel common electrodes about the electrode array(s). The voltage is adjusted so that the dominant field line formed directly beneath the array 504 is sufficiently strong to switch the addressed colorant molecule(s) and divided return lines are not. Additional information regarding alternate embodiments and scanning mechanisms are discussed in the above-mentioned co-pending application.

Present Teachings

The present disclosure relates generally to electronic and optical devices whose functional length scales are measured in nanometers, or larger and, more particularly, to classes of molecules that provide both electronic and optical switching. The electronic and/or optical devices both of micrometer and nanometer scale may be constructed in accordance with the teachings herein.

In the parent application to the present application, a molecular system is disclosed and claimed provided for nanometer-scale reversible electronic and optical switches, specifically, electric field-activated molecular switches that have an electric field induced band gap change that occurs via a molecular conformation change or a tautomerization.

Changing of extended conjugation via chemical bonding change to change the band gap is accomplished by providing the molecular system with one rotating portion (rotor) and two or more stationary portions (stators), between which the rotor is attached. In this case, one of the stators could be a substrate, to which a rotor is directly attached, such as by a linear coupler, which could rotate or not with the rotor.

The molecular system of the parent application, described below with reference to FIG. 6, has three branches (first, second, and third branches) with one end of each branch connected to a junction unit to form a "Y" configuration. The first and second branches are on one side of the junction unit and the third branch is on the opposite side of the junction unit. The first branch contains a first stator unit in its backbone, the junction unit comprises a second stator unit, and the first branch further contains a rotor unit in its backbone between the first stator unit and the second stator unit. The rotor unit rotates between two states as a function of an externally applied field. The second branch includes an insulating supporting group in its backbone for providing a length of the second branch substantially equal to that of the first branch.

As in the parent application, the embodiments herein turn molecules into active electronic devices that can be switched with an external electric field. Where the parent application employs a single rotatable middle segment (rotor) on one branch, in the present application, the general idea is to design into the molecules two or more rotatable middle segments, or rotors, that each have a large dipole moment and that link two other portions of the molecule that are immobilized (stators). Under the influence of an applied electric field, the vector dipole moment of each rotor will attempt to align parallel to the direction of the external field. The molecule may be designed such that there are inter- and/or intra-molecular forces, such as hydrogen bonding or dipole-dipole interactions as well as steric repulsions, that stabilize the rotors in particular orientations with respect to the stators. In that case, a large field would be required to cause the rotors to unlatch from their initial orientation and rotate with respect to the stators, if the direction of the applied field is opposite to that of the dipoles of the rotors. Once switched into a particular orientation, the molecule would remain in that orientation until it is switched out. However, a component of the molecule design is that there may be intra-molecular and/or inter-molecular steric repulsion that will prevent the rotors from rotating through a complete 180 degree half cycle. Instead, the rotation would be halted by the steric interaction of bulky groups on the stators and/or rotors at an angle of approximately 10 to 170 degrees from the initial orientation. Furthermore, this 10 to 170 degree orientation would be stabilized by a different set of inter- and/or intra-molecular hydrogen bonds or dipole interactions, and thus latched into place even after the applied field is turned off. For switch molecules, this ability to latch the rotor between two states separated by approximately 10 to 170 degrees from the stators is important.

For the orientation where the rotors and stators are all co-planar, the molecule is completely conjugated. Thus, the π- or π- and non-bonding electrons of the molecule are delocalized over the large portion of the molecule. This is an ON state (high conductivity state or optical state I) for the molecule. In the case where the rotor is rotated by 10 to 170 degrees with respect to the stators, the conjugation of the molecule is broken and the π- or π- and non-bonding electrons of the molecule are no longer delocalized over the large portion of the molecule. This is the OFF state (low conductivity state or optical state II) of the molecule. Thus, the molecule is reversibly switchable between the ON and OFF states.

The following requirements must be met:

The molecule must have two or more rotor segments and three or more stator segments;

In one state of the molecule, there should be delocalized π-electrons that extend over a large portion of the molecule (rotors and stators), whereas in the other state, the π-electrons are localized on the rotors and stators;

The connecting unit between rotors and stators can be a single σ-bond or at least one atom with (1) non-bonding electron(s), or (2) π-electrons, or (3) π-electrons and non-bonding electron(s);

The non-bonding electrons, or π-electrons, or π-electrons and non-bonding electron(s) of the rotor(s) and stators can be localized or delocalized depending on the conformation of the molecule, while the rotors rotate when activated by an E-field;

The conformation(s) of the molecule can be E-field dependent or bi-stable;

The bi-stable state(s) can be achieved by intra- or inter-molecular forces such as hydrogen bonding, Coulomb force, van der Waals force, metal ion complex or dipole inter-stabilization; and The band gap of the molecule will change depending on the degree of non-bonding electron, or π-electron, or π-electron and non-bonding electron de-localization of the molecule. This will control the electrical conductivity of the molecule, as well as its optical properties (e.g., color and/or index of refraction, etc.).

The novel bi-modal molecules herein are active elements in electronic and/or optical devices that can be switched with an external electric field. The general idea is to design into the molecules rotatable segments (rotors) that have a large dipole moment (see Examples 1 and 2) and that link two other portions of the molecule that are immobilized (stators). Under the influence of an applied electric field, the vector dipole moment of the rotors will attempt to align parallel to the direction of the external field. However, the molecule is designed such that there are inter- and/or intra-molecular forces, such as hydrogen bonding or dipole-dipole interactions as well as steric repulsions, that stabilize the rotors in particular orientations with respect to the stators. Thus, a large electric field is required to cause the rotors to unlatch from their initial orientation and rotate with respect to the stators.

Once switched into a particular orientation, the molecule will remain in that orientation until it is switched out. However, a key component of the molecule design is that there is a steric or Coulombic repulsion that will prevent the rotors from rotating through a complete 180 degree half cycle. Instead, the rotation is halted by the steric interaction of bulky groups on the rotor and stators at an optically and/or electrically significant angle of typically between 10 and 170 degrees from the initial orientation. For the purposes of illustration, this angle is shown as 90 degrees in the present application. Furthermore, this switching orientation may be stabilized by a different set of inter- and/or intra-molecular hydrogen bonds or dipole interactions, and is thus latched in place even after the applied field is turned off. For switch molecules, this ability to latch the rotors between two states separated by an optically and/or electrically significant rotation from the stators is important.

Further, the molecules may be designed to include the case of no, or low, activation barrier for fast but volatile switching. In this latter situation, bi-stability is not required, and the molecule is switched into one state by the electric field and relaxes back into its original state upon removal of the field ("bi-modal"). In effect, these forms of the bi-modal molecules are "self-erasing". In contrast, with bi-stable molecules, the molecule remains latched in its state upon removal of the field (non-volatile switch), and the presence of the activation barrier in that case requires application of an opposite field to switch the molecule back to its previous state.

When the rotors and stators are all co-planar, the molecule is referred to as "more-conjugated". Thus, the non-bonding electrons, or π-electrons, or π-electrons and non-bonding electrons of the molecule, are delocalized over a large portion of the molecule. This is referred to as an "ON" state for the molecule, or "red-shifted state" ("optical state I"), and/or "high conductive state". In the case where at least one of the rotors is rotated out of conjugation with respect to the stators, the conjugation of the molecule is broken and the π- or π- and non-bonding electrons are localized over smaller portions of the molecule, referred to as "less-conjugated". This is an "OFF" state of the molecule, or "blue-shifted state" ("optical state II") and/or "low conductive state". Thus, the colorant molecule is reversibly switchable between at least two different optical states. It will be appreciated that while a 90 degree rotation of the rotor is often depicted, the rotation in fact may be any angle that alters or changes conjugation, as discussed above.

It will be appreciated by those skilled in the art that in the ideal case, when the rotors and stators are completely coplanar, then the molecule is fully conjugated, and when the rotors are rotated at an angle of, say, 90 degrees with respect to the stators, then the molecule is non-conjugated. However, due to thermal fluctuations, these ideal states are not fully realized, and the molecule is thus referred to as being "more-conjugated" (or "high conductive") in the former case and "less-conjugated" (or "low conductive") in the latter case. Further, the terms "red-shifted" and "blue-shifted" are not meant to convey any relationship to hue, but rather the direction in the electromagnetic energy spectrum of the energy shift of the gap between the HOMO and LUMO states.

Figure 6:
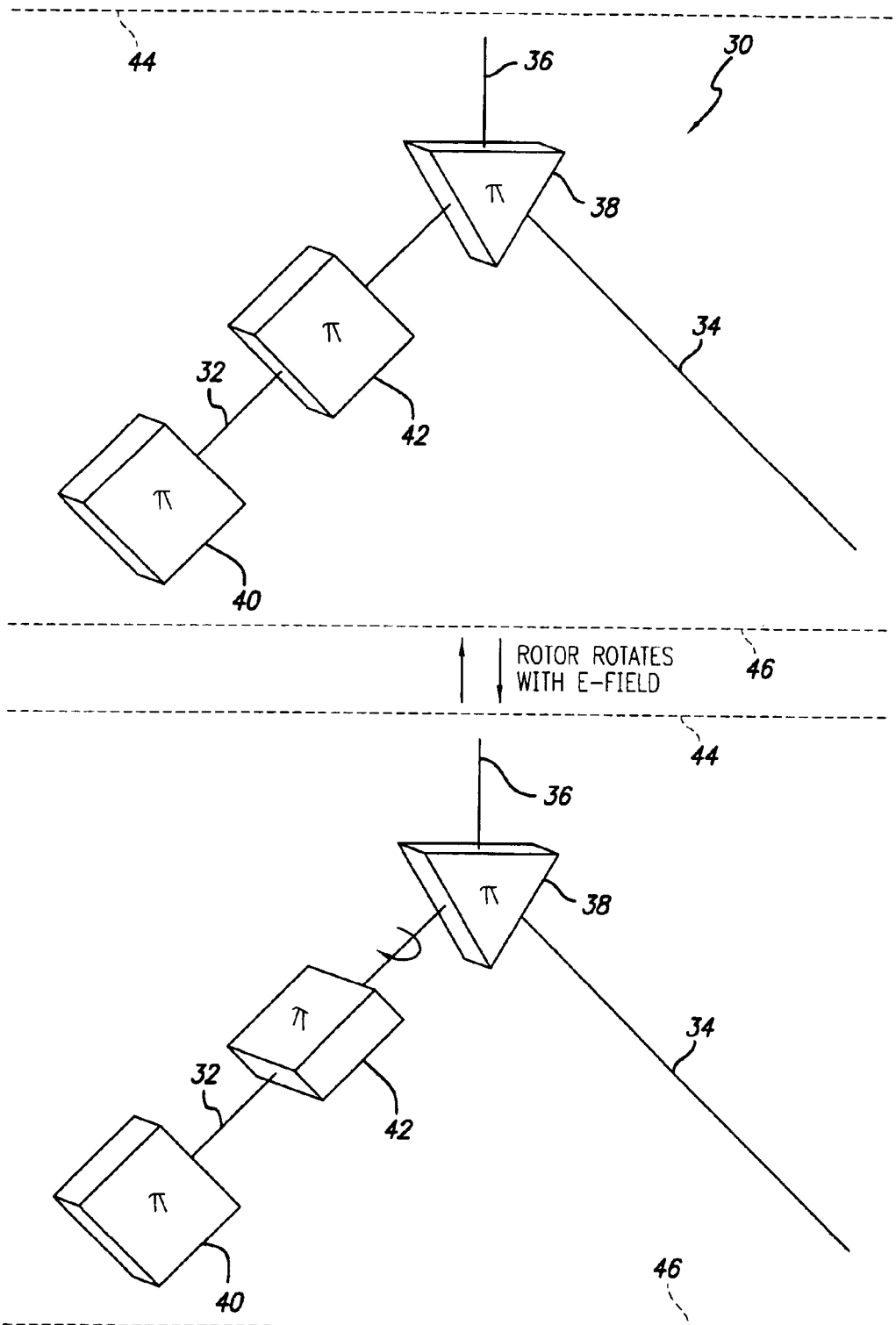
FIG. 6 is a schematic model depicting an E-field-induced band gap change via molecular conformation change (rotor/stator type of model)

FIG. 6 is a schematic model of the molecular system of the parent application, depicting an E-field-induced band gap change via molecular conformation change (rotor/stator type of model). The molecular system 30 has three branches 32, 34, 36 (first, second, and third branches) with one end of each branch connected to a junction unit 38 to form a "Y" configuration. The first and second branches 32, 34 are on one side of the junction unit 38 and the third branch 36 is on the opposite side of the junction unit. The first branch 32 contains a first stator unit 40 in its backbone, the junction unit 38 comprises a second stator unit, and the first branch further contains a rotor 42 unit in its backbone between the first stator unit and the second stator unit. The rotor unit 42 rotates between two states with respect to the two stator units 38, 40 in response to the external electric field applied by electrodes 44, 46. The molecular unit 30 may either be directly connected to the electrodes 44, 46 with connecting units (not shown in FIG. 6) or suspended between the two electrodes. The second branch 34 includes an insulating supporting group in its backbone for providing a length of the second branch substantially equal to that of the first branch 32.

Figure 7:
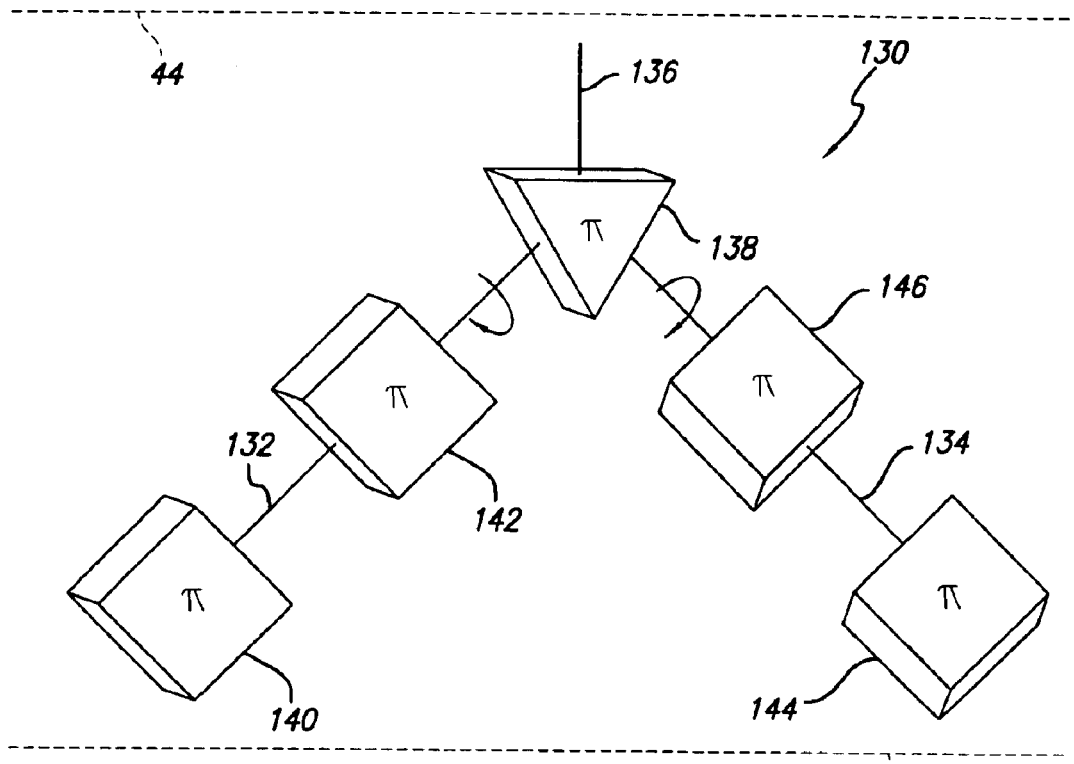
FIG. 7 is a schematic model, similar to FIG. 6, but depicting a "Y" configuration having a rotor unit in each of two branches.

FIG. 7 is a schematic model of an embodiment of a molecular system of the present teachings, depicting an E-field-induced band gap change via molecular conformation change (rotor/stator type of model). The molecular system 130 has three branches 132, 134, 136 (first, second, and third branches) with one end of each branch connected to a junction unit, or connector, 138 to form a "Y" configuration. The first and second branches 132, 134 are on one side of the junction unit 138 and the third branch 136 is on the opposite side of the junction unit. The first branch 132 contains a first stator unit 140 in its backbone, the junction unit 138 comprises a second stator unit, and the first branch further contains a first rotor 142 unit in its backbone between the first stator unit and the second stator unit. Likewise, the second branch 134 contains a third stator unit 144 in its backbone, the junction unit 138 comprises the second stator unit, and the second branch further contains a second rotor unit 146 in its backbone between the third stator unit and the second stator unit. It will be appreciated that there could be more than one rotor unit in a given branch. Both rotor units 142, 146 rotate between two states with respect to their associated two stator units (stator units 138, 140 in the case of the first rotor unit 142 and stator units 138, 144 in the case of the second rotor unit 146) in response to the external electric field applied by electrodes 44, 46. The molecular unit 30 may either be directly connected to the electrodes 44, 46 with connecting units (not shown in FIG. 7, but described below with reference to Example 1b) or suspended between the two electrodes. The two rotor units 142, 146 may be the same or different. If they are the same, then the molecular system 130 has two energy states, caused by the rotation of the rotor units 142, 146 from the more-conjugated state into the less-conjugated state or vice versa. If the rotor units 142, 146 are different, then the molecular system 130 has three energy states (both rotors in the more-conjugated state, one rotor in the less-conjugated state, and both rotors in the less-conjugated state).

The two rotors 142, 146 may be exactly the same with identical switch thresholds (switch at same field strength) or different. The switch threshold is defined by a combination of factors that includes rotor dipole moment and rotational resistance (de-conjugation energy, steric and Coulombic hinderances to rotation).

The number of switch states in a two-rotor "Y" configured molecule depends on whether the rotors are electrically connected in parallel or serial, whether the rotors have different rotational thresholds and whether the third (passive) branch 136 is conductive or non-conductive. When the passive branch 136 is conductive and the rotors have different switch thresholds, there will always be three switch states, independent of the parallel/serial status of the rotors (off, conductive, more conductive). If the two rotors have the same switch thresholds and the passive branch 136 is conductive, then there will always be two switch states, on and off. If the passive branch 136 is non-conductive, then the rotors must be electrically connected in series for there to be any on switch state, and then there is only two switch states, on and off.

Example 1a is a generic molecular example of the teachings herein. In this molecule, a Y configuration, similar to that depicted in FIG. 6, is employed. However, in place of the insulating branch 34, a second rotor is employed on the second branch, connected between the junction unit and another stator unit.

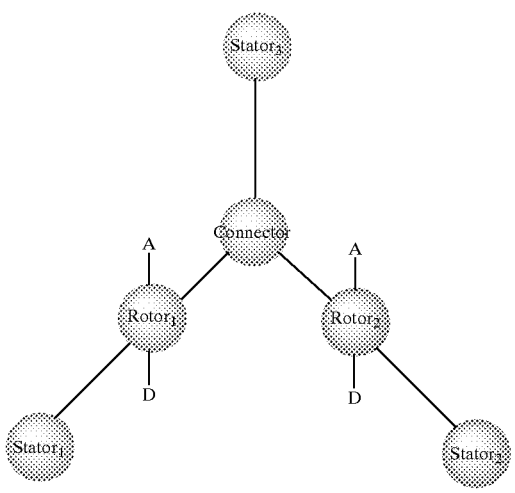

where:

A is an Acceptor group comprising an electron-withdrawing group selected from the group consisting of: (a) hydrogen, (b) carboxylic acid and its derivatives, (c) sulfuric acid and its derivatives, (d) phosphoric acid and its derivatives, (e) nitro, (f) cyano, (g) hetero atoms selected from the group consisting of N, O, S, P, F, Cl, and Br, (h) functional groups with at least one of the hetero atoms, (i) saturated or unsaturated hydrocarbons, and (j) substituted hydrocarbons;

D is a Donor group comprising an electron-donating group selected from the group consisting of: (a) hydrogen, (b) amines, (c) OH, (d) SH, (e) ethers, (f) saturated or unsaturated hydrocarbons, (g) substituted hydrocarbons, and (h) functional groups with at least one hetero atom selected from the group consisting of B, Si, I, N, O, S, and P, wherein the Donor group is more electropositive than the Acceptor group;

$Rotor_1$ and $Rotor_2$ are independently different geometric rotatable systems that may be exactly the same with identical switch thresholds (switch at the same field strength) or different and are conjugating systems selected from substituted single aromatic or polyaromatic hydrocarbons, or conjugated heterocyclic systems, where (1) the aromatic hydrocarbon, or substituted aromatic hydrocarbon, can be either a single ring aromatic (i.e., benzene or substituted benzene) or a poly-aromatic (i.e., naphthalene or its derivatives, acenaphthalene or its derivatives, anthracene or its derivatives, phenanthrene or its derivatives, benzanthracene or its derivatives, dibenzanthracene or its derivatives, fluorene or its derivatives, benzofluorene or its derivatives, fluoranthene or its derivatives, pyrene or its derivatives, benzopyrene or its derivatives, naphthopyrene or its derivatives, chrysene or its derivatives, perylene or its derivatives, benzoperylene or its derivatives, pentacene or its derivatives, coronene or its derivatives, tetraphenylene or its derivatives, triphenylene or its derivatives, decacyclene or its derivatives), and (2) the conjugated heterocyclic system can be either a single ring heterocycle or a fused ring heterocycle, wherein the single ring heterocycle can either be a 5-membered-ring or 6-membered-ring with one or more heteroatoms in the ring, where the heteroatom in the aromatic heterocycles can be an oxygen, sulfur, selenium, nitrogen, or phosphor atom and where the single ring of 5-membered-heterocycles can be one of following: furan and its derivatives, pyrrole and its derivatives, thiophene and its derivatives, porphine and its derivatives, pyrazole and its derivatives, imidazole and its derivatives, triazole and its derivatives, isoxazole and its derivatives, oxadiazole and its derivatives, thiazole and its derivatives, isothiazole and its derivatives, thiadiazole and its derivatives and where the single ring of 6-membered-heterocycles can be one of following: pyridine and its derivatives, pyridazine and its derivatives, pyrimidine and its derivatives, uracil and its derivatives, azauracil and its derivatives, pyrazine and its derivatives, triazine and its derivatives and where the fused ring heterocycles can either a 5-membered fused atomic heterocycle or a 6-membered fused aromatic heterocycle, where the 5-membered fused atomic heterocycle group can be one of following: indole and its derivatives, carbazole and its derivatives, benzofuran and its derivatives, dibenzofuran and its derivatives, thianaphthene and its derivatives, dibenzothiophene and its derivatives, indazole and its derivatives, azaindole and its derivatives, iminostilbene and its derivatives, norharman and its derivatives, benzimidazole and its derivatives, benzotriazole and its derivatives, benzisoxazole and its derivatives, anthranil and its derivatives, benzoxazole and its derivatives, benzothiazole and its derivatives, triazolopyrimidine and its derivatives, triazolopyridine and its derivatives, benzselenazole and its derivatives, purine and its derivatives, etc., and where the 6-membered fused atomic heterocycle group can be one of following: quinoline and its derivatives, and its derivatives, benzoquinoline and its derivatives, acridine and its derivatives, iso quinoline and its derivatives, benzacridine and its derivatives, phenathridine and its derivatives, phenanthroline and its derivatives, phenazine and its derivatives, quinoxaline and its derivatives, etc.; and $Stator_1$, $Stator_2$, $Stator_3$, and Connector are different geometric fixed conjugating systems selected from the group consisting of: (a) saturated or unsaturated hydrocarbons and (b) substituted hydrocarbons, wherein the hydrocarbon units contain conjugated rings that contribute to an extended conjugation of the molecular system when it is in a planar state (red shifted state), wherein the stators optionally contain at least one bridging group, at least one spacing group, or both, wherein the at least one bridging group is either (a) selected from the group consisting of acetylene, ethylene, amide, imide, imine, and azo and is used to connect the stators to the rotors or to connect two or more conjugated rings to achieve a desired optical property, electrical property, or both or (b) selected from the group consisting of a single atom bridge and a direct sigma bond between the rotors and the stators and wherein the at least one spacing group is selected from the group consisting of phenyl, isopropyl, and tert-butyl and is used to provide an appropriate 3-dimensional scaffolding to allow molecular systems to pack together while providing space for each rotor to rotate over a desired range of motion.

It will be appreciated that the element labeled "connector" above may also be considered to be a stator with three branches thereon. Further, it will be appreciated that Stator 1, Stator 2, Stator 3 may or may not include connecting groups CG thereon, depending on the specific application.

The moiety A-D in the examples herein forms a dipole having a dipole moment, which responds to the external E-field by rotating from one energy state to another state, as described above with regard to rotation of the rotors.

Example 1b below is a real molecular example of this embodiment.

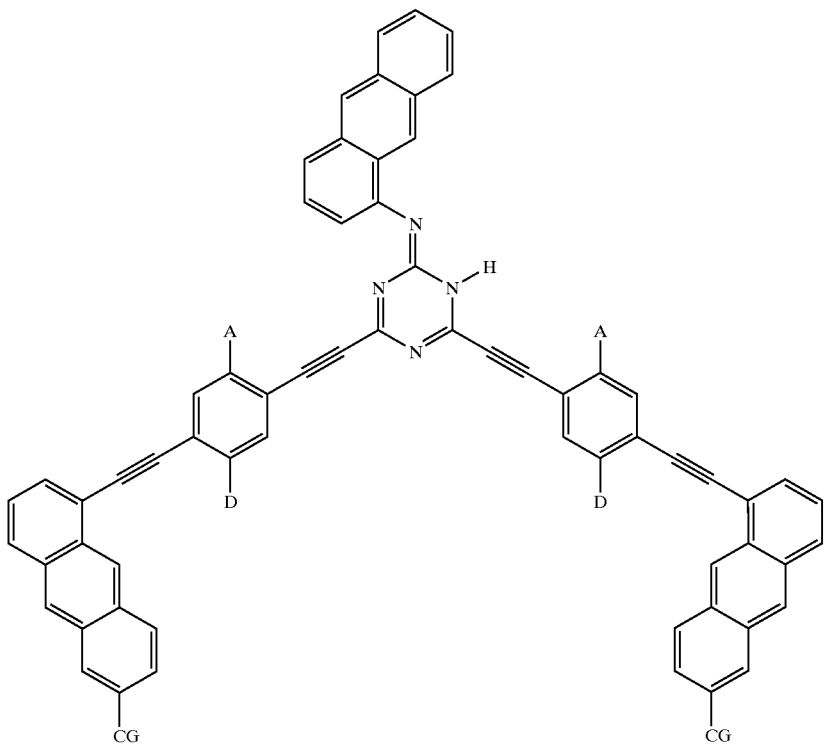

where:

A is the Acceptor group;

D is the Donor group; and

CG are optional connecting units between one molecule and another molecule or between a molecule and the solid substrate. They can be a single connecting unit or multiple connecting units. They may be any one of the following: hydrogen (utilizing a hydrogen bond), multivalent hetero atoms (i.e., C, N, O, S, P, etc.), functional groups containing these hetero atoms (e.g., NH, PH, etc.), hydrocarbons (either saturated or unsaturated), or substituted hydrocarbons.

In Example 1b above, the horizontal dashed lines represent other molecules or solid substrates (which can be either electrode or non-electrode depends on applications) to which the molecule is optionally linked. The direction of the switching field is perpendicular to the horizontal dotted lines. Alternatively, the linking moieties (CG) may be eliminated, and the molecule may be simply placed between the two electrodes. The molecule shown above (Example 1b) has been designed with the internal rotors in a 30 to 70 degree angle to the orientation axis of the entire molecule. In this case, the external field is applied along the orientation axis of the molecule as pictured—the electrodes (horizontal dashed lines) are oriented perpendicular to the plane of the paper and in a 30 to 70 degree angle to the orientation axis of the molecule. Application of an electric field oriented from top to bottom in the diagrams will cause the rotors to rotate such that they are, in one position, more coplanar with the rest of the molecule or, in the other position, less coplanar with the rest of the molecule. In the latter case, where the rotors are not coplanar with the rest of the molecule, this is the "OFF state" of the molecule, whereas where the rotors are coplanar with the rest of the molecule, this is the "ON state" of the molecule.

The foregoing description assumes that both rotors are identical. Such an ON/OFF switch is particularly useful for electrical switches, such as used in memory or logic devices, or for switching between two colors (or between transparent and one color).

When the molecule depicted in Example 1b is in a less-conjugated state (or "OFF state"), the molecule is less conductive, and its color is chromatically transparent, or blue-shifted in its π-system "localized state". In the more conjugated state ("ON state"), the molecule evidences high conductivity, and the color of the molecule is red-shifted.

In the case where the rotors are not identical, then intermediate energetic states become possible. Where there are more than two energetic states, a different color may be associated with each state, thereby giving rise to the possibility of creating colored displays.

For the molecules of Example 1b, a single monolayer molecular film is grown, for example, using Langmuir-Blodgett techniques or self-assembled monolayers, such that the orientation axis of the molecules is perpendicular to the plane of the electrodes used to switch the molecules. Electrodes may be deposited in the manner described by Collier et al, supra, or methods described in the above-referenced patent applications. Alternate thicker film deposition techniques include vapor phase deposition, contact or ink-jet printing, or silk screening.

Figure 8:
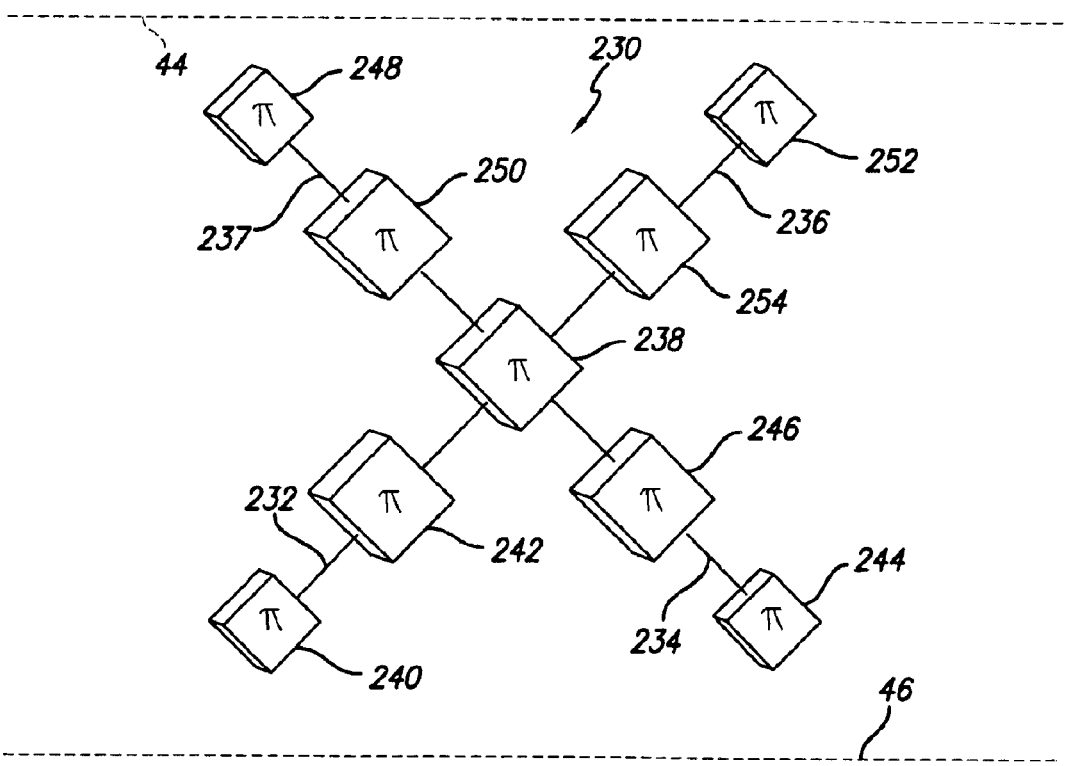
FIG. 8 is a schematic model similar to FIG. 7, but depicting an "X" configuration having a rotor unit in each of four branches.

FIG. 8 is a schematic model of another embodiment of a molecular system of the present teachings, depicting an E-field-induced band gap change via molecular conformation change (rotor/stator type of model). The molecular system 230 has four branches 232, 234, 236, 237 (first, second, third, and fourth branches) with one end of each branch connected to a junction unit 238 to form an "X" configuration. The first and second branches 232, 234 are on one side of the junction unit 238 and the third and fourth branches 236, 237 are on the opposite side of the junction unit. Each branch contains a stator unit in its backbone, the junction unit 238 comprises a second stator unit, and each branch contains a rotor unit in its backbone between the stator unit and the junction unit. For branch 232, the rotor 242 is between the stator units 238, 240; for branch 234, the rotor 246 is between the stator units 238, 244; for branch 236, the rotor 250 is between the stator units 238, 248; and for branch 237, the rotor 254 is between the stator units 238 and 252. It will be appreciated that there could be more than one rotor unit in a given branch. Each rotor unit rotates between two states with respect to its associated two stator units in response to the external electric field applied by electrodes 44, 46. The molecular unit 230 may either be directly connected to the electrodes 44, 46 with connecting units (not shown in FIG. 8, but described below with reference to Example 2b) or suspended between the two electrodes. The four rotor units 242, 246, 250, 254 may be the same or different. If they are the same, then the molecular system 230 has two energy states, caused by the rotation of the rotor units 242, 246, 250, 254 into the more fully conjugated state or into the less conjugated state. If the rotor units 242, 246, 250, 254 are different, then the molecular system 230 has at least four possible energy states: four energy states for electrical switching (OFF—all rotors off; conductive—two rotors, each on opposite sides of the junction unit 238, on; more conductive—three rotors on; and yet more conductive—four rotors on) and five states for optical switching (most colored—all rotors on; then a different color for each of the four rotors switching off, rotating in sequence with the added E-field, assuming each rotor as a different switching energy).

Example 2a is another generic molecular example of the teachings herein. In this molecule, an X configuration is employed. Here, a rotor is placed on each of the four branches, connected between the junction unit and a stator unit at the end of each branch.

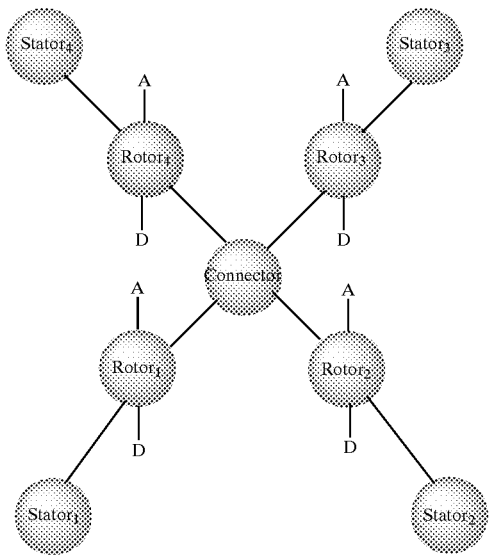

where:
- A is an Acceptor group comprising an electron-withdrawing group selected from the group consisting of: (a) hydrogen, (b) carboxylic acid and its derivatives, (c) sulfuric acid and its derivatives, (d) phosphoric acid and its derivatives, (e) nitro, (f) cyano, (g) hetero atoms selected from the group consisting of N, O, S, P, F, Cl, and Br, (h) functional groups with at least one of the hetero atoms, (i) saturated or unsaturated hydrocarbons, and (j) substituted hydrocarbons;
- D is a Donor group comprising an electron-donating group selected from the group consisting of: (a) hydrogen, (b) amines, (c) OH, (d) SH, (e) ethers, (f) saturated or unsaturated hydrocarbons, (g) substituted hydrocarbons, and (h) functional groups with at least one hetero atom selected from the group consisting of B, Si, I, N, O, S, and P, wherein the Donor group is more electropositive than the Acceptor group;
- $Rotor_1$ and $Rotor_2$ are independently different geometric rotatable systems that may be exactly the same with identical switch thresholds (switch at the same field strength) or different and are conjugating systems selected from substituted single aromatic or polyaromatic hydrocarbons, or conjugated heterocyclic systems, where (1) the aromatic hydrocarbon, or substituted aromatic hydrocarbon, can be either a single ring aromatic (i.e., benzene or substituted benzene) or a poly-aromatic (i.e., naphthalene or its derivatives, acenaphthalene or its derivatives, anthracene or its derivatives, phenanthrene or its derivatives, benzanthracene or its derivatives, dibenzanthracene or its derivatives, fluorene or its derivatives, benzofluorene or its derivatives, fluoranthene or its derivatives, pyrene or its derivatives, benzopyrene or its derivatives, naphthopyrene or its derivatives, chrysene or its derivatives, perylene or its derivatives, benzoperylene or its derivatives, pentacene or its derivatives, coronene or its derivatives, tetraphenylene or its derivatives, triphenylene or its derivatives, decacyclene or its derivatives), and (2) the conjugated heterocyclic system can be either a single ring heterocycle or a fused ring heterocycle, wherein the single ring heterocycle can either be a 5-membered-ring or 6-membered-ring with one or more heteroatoms in the ring, where the heteroatom in the aromatic heterocycles can be an oxygen, sulfur, selenium, nitrogen, or phosphor atom and where the single ring of 5-membered-heterocycles can be one of following: furan and its derivatives, pyrrole and its derivatives, thiophene and its derivatives, porphine and its derivatives, pyrazole and its derivatives, imidazole and its derivatives, triazole and its derivatives, isoxazole and its derivatives, oxadiazole and its derivatives, thiazole and its derivatives, isothiazole and its derivatives, thiadiazole and its derivatives and where the single ring of 6-membered-heterocycles can be one of following: pyridine and its derivatives, pyridazine and its derivatives, pyrimidine and its derivatives, uracil and its derivatives, azauracil and its derivatives, pyrazine and its derivatives, triazine and its derivatives and where the fused ring heterocycles can either a 5-membered fused atomic heterocycle or a 6-membered fused aromatic heterocycle, where the 5-membered fused atomic heterocycle group can be one of following: indole and its derivatives, carbazole and its derivatives, benzofuran and its derivatives, dibenzofuran and its derivatives, thianaphthene and its derivatives, dibenzothiophene and its derivatives, indazole and its derivatives, azaindole and its derivatives, iminostilbene and its derivatives, norharman and its derivatives, benzimidazole and its derivatives, benzotriazole and its derivatives, benzisoxazole and its derivatives, anthranil and its derivatives, benzoxazole and its derivatives, benzothiazole and its derivatives, triazolopyrimidine and its derivatives, triazolopyridine and its derivatives, benzselenazole and its derivatives, purine and its derivatives, etc., and where the 6-membered fused atomic heterocycle group can be one of following: quinoline and its derivatives, and its derivatives, benzoquinoline and its derivatives, acridine and its derivatives, iso quinoline and its derivatives, benzacridine and its derivatives, phenathridine and its derivatives, phenanthroline and its derivatives, phenazine and its derivatives, quinoxaline and its derivatives, etc.; and Stator$_1$, Stator$_2$, Stator$_3$, Stator$_4$, and Connector are different geometric fixed conjugating systems selected from the group consisting of: (a) saturated or unsaturated hydrocarbons and (b) substituted hydrocarbons, wherein the hydrocarbon units contain conjugated rings that contribute to an extended conjugation of the molecular system when it is in a planar state (red shifted state), wherein the stators optionally contain at least one bridging group, at least one spacing group, or both, wherein the at least one bridging group is either (a) selected from the group consisting of acetylene, ethylene, amide, imide, imine, and azo and is used to connect the stators to the rotor or to connect two or more conjugated rings to achieve a desired optical property, electrical property, or both or (b) selected from the group consisting of a single atom bridge and a direct sigma bond between the rotor and the stators and wherein the at least one spacing group is selected from the group consisting of phenyl, isopropyl, and tert-butyl and is used to provide an appropriate 3-dimensional scaffolding to allow molecular systems to pack together while providing space for each rotor to rotate over a desired range of motion.

It will be appreciated that the element labeled "connector" above may also be considered to be a stator with four branches thereon. Further, it will be appreciated that Stator 1, Stator 2, Stator 3, Stator 4 may or may not include connecting groups CG thereon, depending on the specific application.

Example 2b below is a real molecular example of this embodiment.

where:
A is the Acceptor group;
D is the Donor group; and
CG are the optional connecting units.

As in Example 1b, electrodes are shown, with which the molecule is associated, either by direct connection through the CG groups or by virtue of being suspended between the two electrodes.

The field-switchable molecules of the present disclosure may be used in the electrical switch and optical switch applications described in FIGS. 1–5, as well as in other electrical and optical applications, as mentioned above.

Specifically, a new type of switching mechanism is introduced herein that distinguish it from the prior art, namely, an electric field ("E-field") induced rotation of a rotatable section (rotor) of a molecule to change the band gap of the molecule. The molecule is never oxidized nor reduced in the toggling of the switch, in contrast to prior art approaches. Also, the part of the molecule that moves is quite small, so the switching time is expected to be quite fast. Also, the molecules are much simpler and thus easier and cheaper to make than the rotaxanes, catenanes, and related compounds.

The technology disclosed and claimed herein for forming crossed wires (micro-meter or nanometer) may be used to perform a variety of functions and to form a variety of useful devices and circuits for implementing computing on a microscale and even on a nanoscale. For example, applications include molecular wire crossbar memory (U.S. Pat. No. 6,128,214), molecular wire crossbar interconnects (MWCI) for signal routing and communications (U.S. Pat. No. 6,314,019), molecular wire crossbar memory (U.S. Pat. No. 6,128,214), molecular wire crossbar logic (MWCL) employing programmable logic arrays, a demultiplexer for a molecular wire crossbar network (U.S. Pat. No. 6,256,767), molecular wire transistors (U.S. Pat. No. 6,559,468), and an addressable matrix of electrodes for addressing pixels for display purposes (U.S. Pat. No. 6,556,470). As illustrated in FIG. 2, for example, the switch 10 can be replicated in a two-dimensional array to form a plurality, or array, 60 of switches to form a crossbar switch 60.

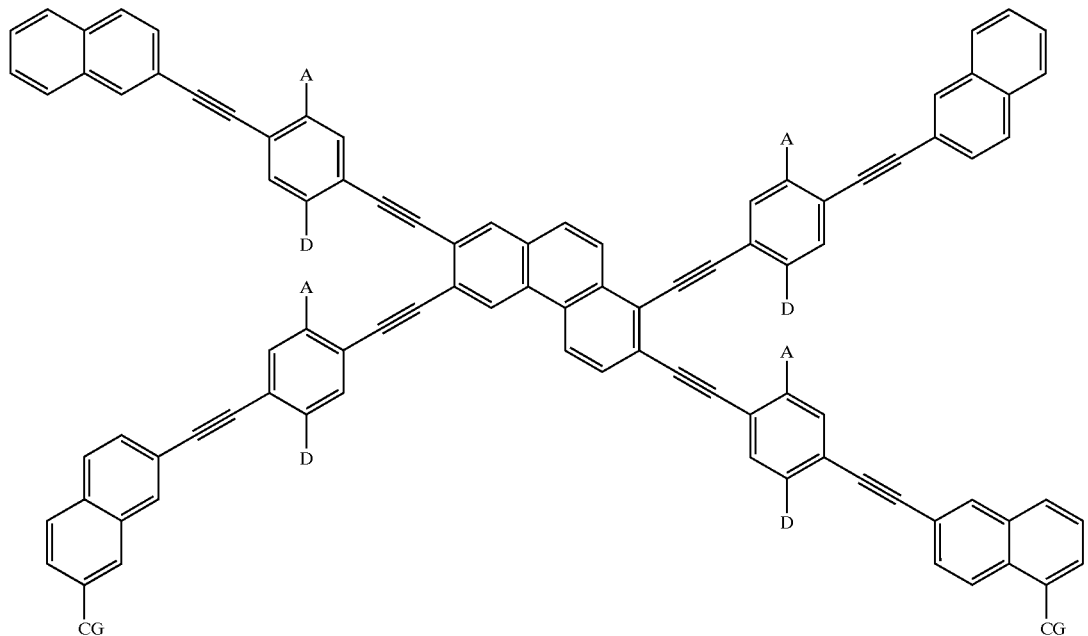

Further, the technology disclosed and claimed herein for forming optical switches (micro-meter or nanometer) may be used to assemble displays, electronic books, rewrittable media, electrically tunable optical lenses, electrically controlled tinting for windows and mirrors, optical crossbar switches for routing signals from one of many incoming channels to one of many outgoing channels, and more.

The present teachings provide molecular reversible electronic and/or optical switches that can be assembled easily to make crossbar and other circuits. The crossbar circuits have been described in the above-listed series of patent applications and issued patents. The circuits provide memory, logic and communications functions. One example of the electronic switches is the so-called crossed-wire device, which comprises a pair of crossed wires that form a junction where one wire crosses another at an angle other than zero degrees and at least one connector species connecting the pair of crossed wires in the junction. The junction has a functional dimension in nanometers or larger for multilayers. The connector species comprises the molecular system disclosed and claimed herein.

The present teachings introduce a new type of switching mechanism, namely, an electric field induced rotation of a rotatable middle section (rotor) of a molecule. Thus, the molecule is neither oxidized nor reduced in the toggling of the switch, which avoids the necessity of breaking chemical bonds and potentially initiating a nonreversible reaction. Also, the part of the molecule that moves is quite small, so the switching time should be very fast. Also, the molecules are much simpler and thus easier and cheaper to make than the rotaxanes and related compounds.

The devices disclosed herein are generically considered to be electric field devices, and are to be distinguished from earlier embodiments (described in the above-mentioned related patent applications and patent) that are directed to electrochemical devices.

The molecular systems disclosed herein are expected to find use in a variety of applications, including, but not limited to, memories, logic devices, multiplexers, demultiplexers, configurable interconnects for integrated circuits, field-programmable gate arrays (FGPAs), crossbar switches, and communication devices, such as cellular phones, mobile appliances, personal digital assistants (PDAs), display, and optical switches.

Alternative structures, comprising more than three branches, can also be employed. For example, a two-sided brush or comb structure may be constructed having, for example, a backbone parallel to the substrates and multiple (more than four) rotor-containing branches oriented nominally orthogonal to the backbone and connecting to the substrates. The backbone could comprise a string of conjugated or non-conjugated stators, such as a polyphenyl-type structure, for example. In this instance, more than four branches are possible within the general teachings herein.

The concept of a plurality of energetic states for multiple different rotors was described above. In the general case, an n-rotor system only has up to n+1 possible digital switch states (including all rotors switched off). Each rotor will always switch when the E-field is at or above a threshold defined by the rotor dipole moment. Thus, in the example of a four rotor system, as the E-field is ramped from zero, there are the following switch states: 0000, 1000, 1100, 1110, 1111 (rotors ordered in accordance with minimum switching field). There will likely be intermediate switch states for partial rotor rotations, both in color and electrical function.

Industrial Applicability

The field-switchable molecules disclosed herein are expected to find use in micro-scale and nano-scale electronic devices as well as in optical devices constructed from micro-scale and even nano-scale components, including a variety of visual displays.

What is claimed is:

1. A molecular system having at least three branches, with one end of each branch connected to an immobile junction unit, with two of said branches on one side of said junction unit and with at least one other branch on the opposite side of said junction unit, wherein either:

said molecular system comprises three branches, wherein said two branches each contain an immobile stator unit in its backbone, and said two branches each further contain at least one rotatable rotor unit in its backbone between said stator unit and said junction unit; or said molecular system comprises four branches, with two of said branches on one side of said junction unit and with two other said branches on the opposite side thereof wherein each branch contains contain an immobile stator unit in its backbone, and each branch further contain a rotatable rotor unit in its backbone between said stator unit and said junction unit, wherein each rotor unit rotates between two states as a function of an externally-applied field.

2. The molecular system of claim 1 wherein said molecular system comprises three branches, thereby forming a "Y" configuration.

3. The molecular system of claim 2 wherein said third branch contains a third immobile stator unit in its backbone.

4. The molecular system of claim 2 having the general structure

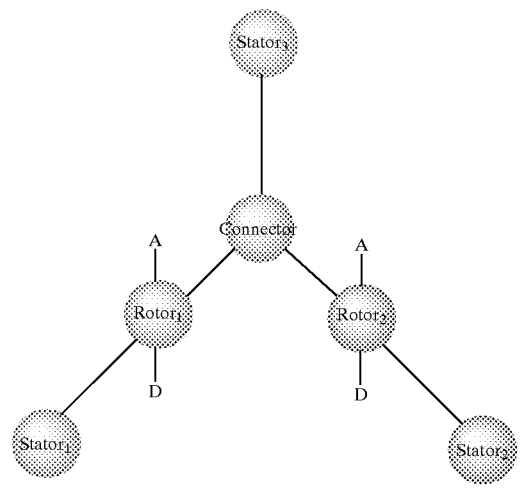

where:

A⁻ is an Acceptor group comprising an electron-withdrawing group selected from the group consisting of: (a) hydrogen, (b) carboxylic acid and its derivatives, (c) sulfuric acid and its derivatives, (d) phosphoric acid and its derivatives, (e) nitro, (f) cyano, (g) hetero atoms selected from the group consisting of N, O, S, P, F, Cl, and Br, (h) functional groups with at least one of said hetero atoms, (i) saturated or unsaturated hydrocarbons, and (j) substituted hydrocarbons;

$D^+$ is a Donor group comprising an electron-donating group selected from the group consisting of: (a) hydrogen, (b) amines, (c) OH, (d) SH, (e) ethers, (f) saturated or unsaturated hydrocarbons, (g) substituted hydrocarbons, and (h) functional groups with at least one hetero atom selected from the group consisting of B, Si, I, N, O, S, and P, wherein said Donor group is more electropositive than said Acceptor group;

$Rotor_1$ and $Rotor_2$ are independently different geometric rotatable systems that may be exactly the same with identical switch thresholds or different and are conjugating systems selected from substituted single aromatic or polyaromatic hydrocarbons, or conjugated heterocyclic systems, where (1) the aromatic hydrocarbon, or substituted aromatic hydrocarbon, can be either a single ring aromatic or a poly-aromatic and (2) the conjugated heterocyclic system can be either a single ring heterocycle or a fused ring heterocycle; and $Stator_1$, $Stator_2$, $Stator_3$, and Connector are different geometric fixed conjugating systems selected from the group consisting of: (a) saturated or unsaturated hydrocarbons and (b) substituted hydrocarbons, wherein said hydrocarbon units contain conjugated rings that contribute to an extended conjugation of said molecular system when it is in a planar state (red shifted state), wherein said stators optionally contain at least one bridging group $G_n$, at least one spacing group $R_n$, or both, wherein said at least one bridging group is either (a) selected from the group consisting of acetylene, ethylene, amide, imide, imine, and azo and is used to connect said stators to said rotor or to connect two or more conjugated rings to achieve a desired optical property, electrical property, or both or (b) selected from the group consisting of a single atom bridge and a direct sigma bond between said rotor and said stators and wherein said at least one spacing group is selected from the group consisting of phenyl, isopropyl, and tert-butyl and is used to provide an appropriate 3-dimensional scaffolding to allow molecular systems to pack together while providing space for each rotor to rotate over a desired range of motion.

5. The molecular system of claim 4 having the formula where:

A is said Acceptor group;

D is said Donor group; and

CG are said optional connecting units.

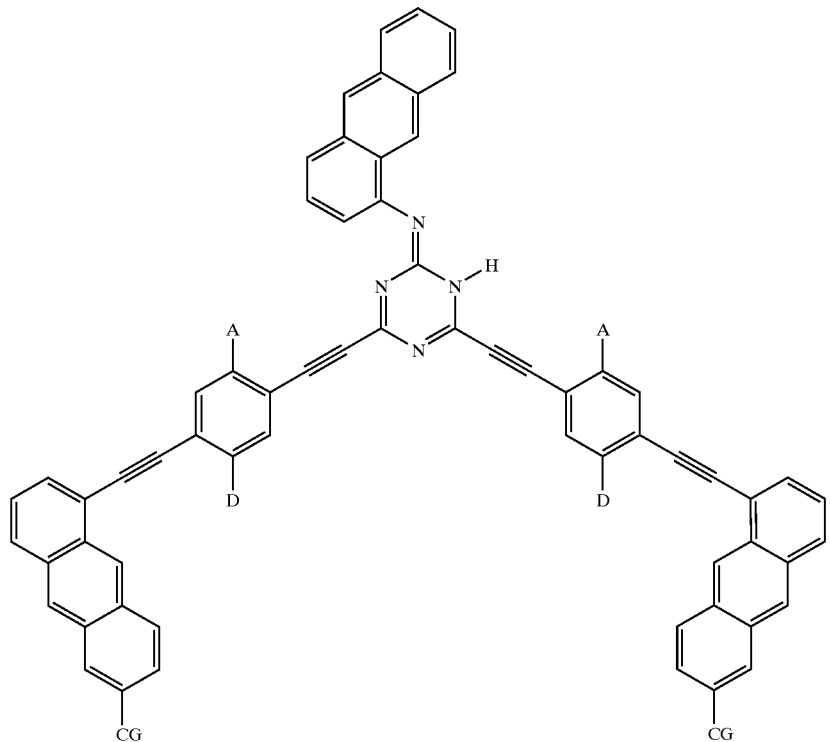

6. The molecular system of claim 1 wherein said molecular system comprises four branches, thereby forming an "X" configuration.

7. The molecular system of claim 6 having the general structure

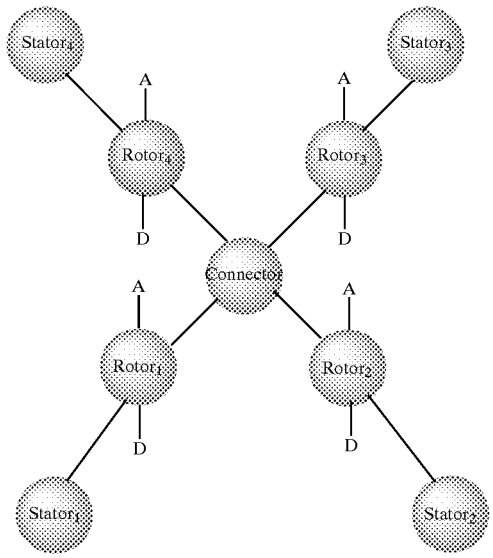

where:
- A⁻ is an Acceptor group comprising an electron-withdrawing group selected from the group consisting of: (a) hydrogen, (b) carboxylic acid and its derivatives, (c) sulfuric acid and its derivatives, (d) phosphoric acid and its derivatives, (e) nitro, (f) cyano, (g) hetero atoms selected from the group consisting of N, O, S, P, F, Cl, and Br, (h) functional groups with at least one of said hetero atoms, (i) saturated or unsaturated hydrocarbons, and (j) substituted hydrocarbons;
- D⁺ is a Donor group comprising an electron-donating group selected from the group consisting of: (a) hydrogen, (b) amines, (c) OH, (d) SH, (e) ethers, (f) saturated or unsaturated hydrocarbons, (g) substituted hydrocarbons, and (h) functional groups with at least one hetero atom selected from the group consisting of B, Si, I, N, O, S, and P, wherein said Donor group is more electropositive than said Acceptor group;
- Rotor$_1$ and Rotor$_2$ are independently different geometric rotatable systems that may be exactly the same with identical switch thresholds or different and are conjugating systems selected from substituted single aromatic or polyaromatic hydrocarbons, or conjugated heterocyclic systems, where (1) the aromatic hydrocarbon, or substituted aromatic hydrocarbon, can be either a single ring aromatic or a poly-aromatic and (2) the conjugated heterocyclic system can be either a single ring heterocycle or a fused ring heterocycle; and
- Stator$_1$, Stator$_2$, Stator$_3$, Stator$_4$, and Connector are different geometric fixed conjugating systems selected from the group consisting of: (a) saturated or unsaturated hydrocarbons and (b) substituted hydrocarbons, wherein said hydrocarbon units contain conjugated rings that contribute to an extended conjugation of said molecular system when it is in a planar state (red shifted state), wherein said stators optionally contain at least one bridging group G$_n$, at least one spacing group R$_n$, or both, wherein said at least one bridging group is either (a) selected from the group consisting of acetylene, ethylene, amide, imide, imine, and azo and is used to connect said stators to said rotor or to connect two or more conjugated rings to achieve a desired optical property, electrical property, or both or (b) selected from the group consisting of a single atom bridge and a direct sigma bond between said rotor and said stators and wherein said at least one spacing group is selected from the group consisting of phenyl, isopropyl, and tert-butyl and is used to provide an appropriate 3-dimensional scaffolding to allow molecular systems to pack together while providing space for each rotor to rotate over a desired range of motion.

8. The molecular system of claim 7 having the formula

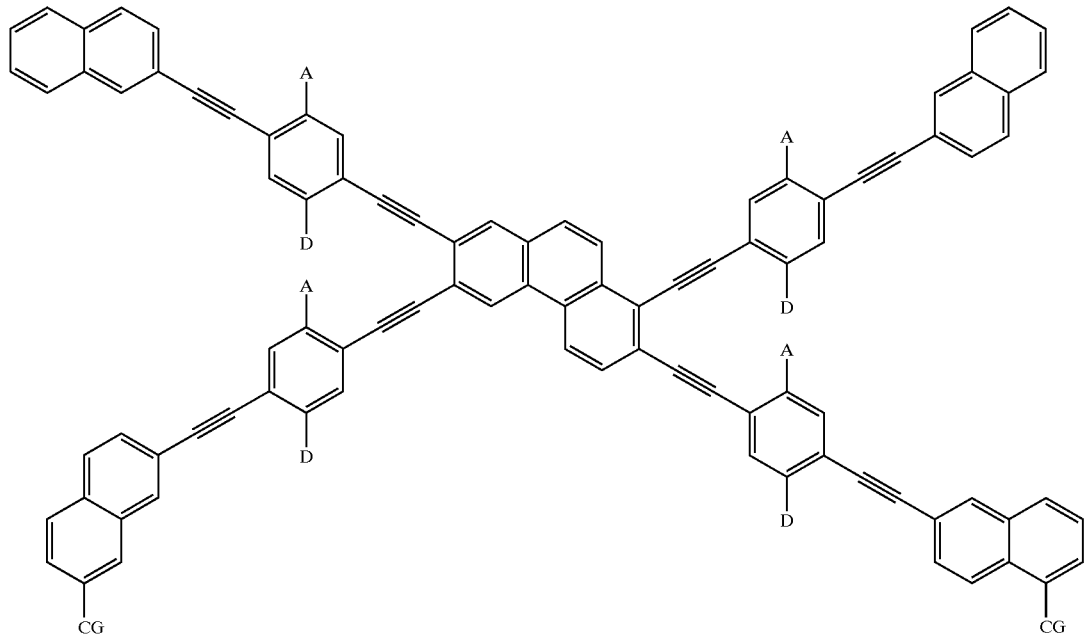

where:
- A⁻ is said Acceptor group;
- D⁺ is said Donor group; and
- CG are said optional connecting units.

9. The molecular system of claim 1 wherein at least some of said rotors have the same dipole moment.

10. The molecular system of claim 9 wherein all said rotors have the same dipole moment.

11. The molecular system of claim 1 wherein all said rotors have different dipole moments from each other.

12. The molecular system of claim 1 wherein each said branch further contains at least one connecting unit at its terminus, said connecting unit for connecting said molecular system to other said molecular systems or to substrates.

13. The molecular system of claim 1 wherein each said branch further includes at least one moiety selected from the group consisting of at least one bridging group and at least one spacing group, said at least one bridging group for connecting a stator to a rotor or to connect at least two conjugated rings to achieve a desired effect selected from the group consisting of electrical effects and optical effects and said at least one spacing group for providing a three-dimensional scaffolding to allow said molecular system to pack together with other said molecular systems while providing space for each rotor to rotate over a desired range of motion.

14. The molecular system of claim 1 wherein said two branches are each connected to a first electrode and wherein said at least one other branch is connected to a second electrode, to which said externally-applied electric field is connected, thereby forming an electrical switch.

15. The molecular system of claim 1 wherein said molecular system is suspended between two electrodes such that said two branches are each electrically associated with a first electrode and wherein said at least one other branch is electrically associated with a second electrode, to which said externally-applied electric field is connected, thereby forming an optical switch.

16. A multi-stable molecular mechanical device comprising a molecular system configured within an electric field generated by a pair of electrodes and electrically connected thereto, said molecular system having at least three branches, with one end of each branch connected to an immobile junction unit, with two of said branches on one side of said junction unit and with at least one other branch on the opposite side of said junction unit, wherein either:

said molecular system comprises three branches, wherein said two branches each contain an immobile stator unit in its backbone, and said two branches each further contain at least one rotatable rotor unit in its backbone between said stator unit and said junction unit; or said molecular system comprises four branches, with two of said branches on one side of said junction unit and with two other said branches on the opposite side thereof wherein each branch contains contain an immobile stator unit in its backbone, and each branch further contain at least one rotatable rotor unit in its backbone between said stator unit and said junction unit, wherein each rotor portion rotates with respect to its associated stator portions between at least two different states upon application of said electric field, thereby inducing a band gap change in said molecular system, wherein in a first state, there is extended conjugation over at least most of said molecular system, resulting in a relatively smaller band gap, and wherein in a second state, said extended conjugation is changed, resulting in a relatively larger band gap, and wherein in intermediate states, said conjugation is intermediate between that of said first state and that of said second state.

17. The molecular device of claim 16 wherein said molecular system comprises three branches, thereby forming a "Y" configuration.

18. The molecular device of claim 17 wherein said third branch contains a third immobile stator unit in its backbone.

19. The molecular device of claim 17 having the general structure

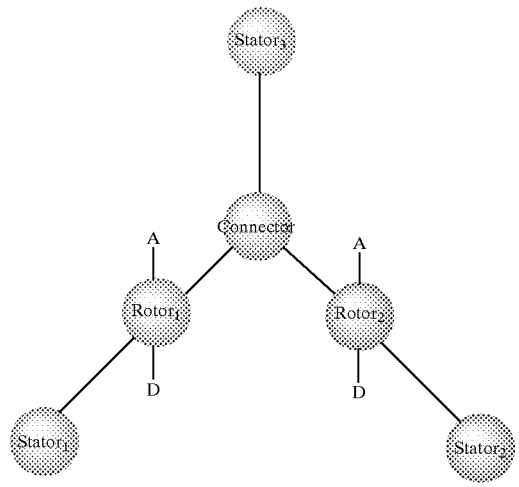

where:
A⁻ is an Acceptor group comprising an electron-withdrawing group selected from the group consisting of: (a) hydrogen, (b) carboxylic acid and its derivatives, (c) sulfuric acid and its derivatives, (d) phosphoric acid and its derivatives, (e) nitro, (f) cyano, (g) hetero atoms selected from the group consisting of N, O, S, P, F, Cl, and Br, (h) functional groups with at least one of said hetero atoms, (i) saturated or unsaturated hydrocarbons, and (j) substituted hydrocarbons;

D⁺ is a Donor group comprising an electron-donating group selected from the group consisting of: (a) hydrogen, (b) amines, (c) OH, (d) SH, (e) ethers, (f) saturated or unsaturated hydrocarbons, (g) substituted hydrocarbons, and (h) functional groups with at least one hetero atom selected from the group consisting of B, Si, I, N, O, S, and P, wherein said Donor group is more electropositive than said Acceptor group;

Rotor$_1$ and Rotor$_2$ are independently different geometric rotatable systems that may be exactly the same with identical switch thresholds or different and are conjugating systems selected from substituted single aromatic or polyaromatic hydrocarbons, or conjugated heterocyclic systems, where (1) the aromatic hydrocarbon, or substituted aromatic hydrocarbon, can be either a single ring aromatic or a poly-aromatic and (2) the conjugated heterocyclic system can be either a single ring heterocycle or a fused ring heterocycle; and Stator$_1$, Stator$_2$, Stator$_3$, and Connector are different geometric fixed conjugating systems selected from the group consisting of: (a) saturated or unsaturated hydrocarbons and (b) substituted hydrocarbons, wherein said hydrocarbon units contain conjugated rings that contribute to an extended conjugation of said molecular system when it is in a planar state (red shifted state), wherein said stators optionally contain at least one bridging group $G_n$, at least one spacing group $R_n$, or both, wherein said at least one bridging group is either (a) selected from the group consisting of acetylene, ethylene, amide, imide, imine, and azo and is used to connect said stators to said rotor or to connect two or more conjugated rings to achieve a desired optical property, electrical property, or both or (b) selected from the group consisting of a single atom bridge and a direct sigma bond between said rotor and said stators and wherein said at least one spacing group is selected from the group consisting of phenyl, isopropyl, and tert-butyl and is used to provide an appropriate 3-dimensional scaffolding to allow molecular systems to pack together while providing space for each rotor to rotate over a desired range of motion.

20. The molecular device of claim 19 having the formula

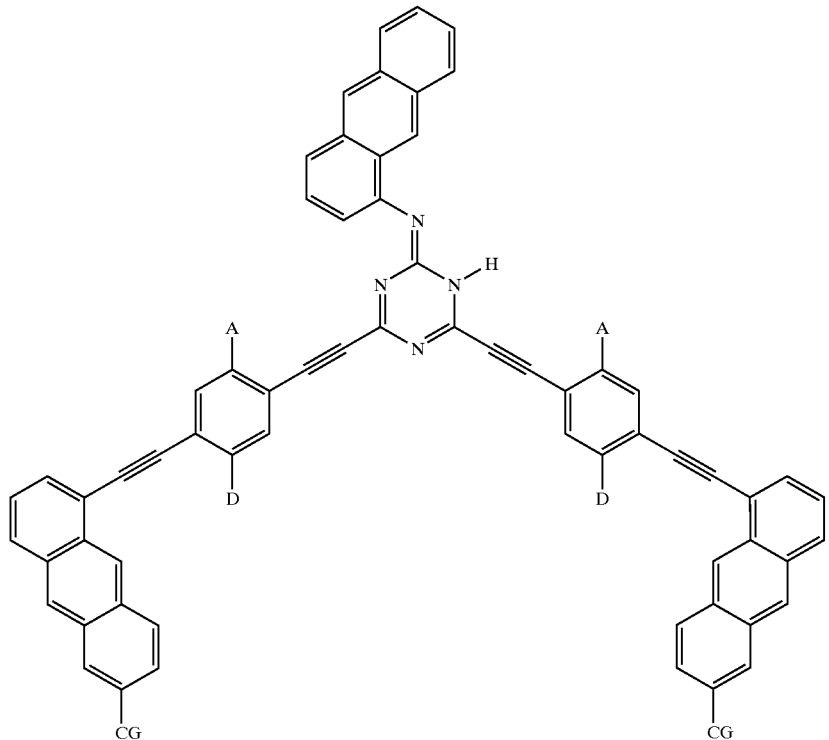

where:
A⁻ is said Acceptor group;
D⁺ is said Donor group; and
CG are said optional connecting units.

21. The molecular device of claim 16 wherein said molecular system comprises four branches, thereby forming an "X" configuration.

22. The molecular device of claim 21 having the general structure

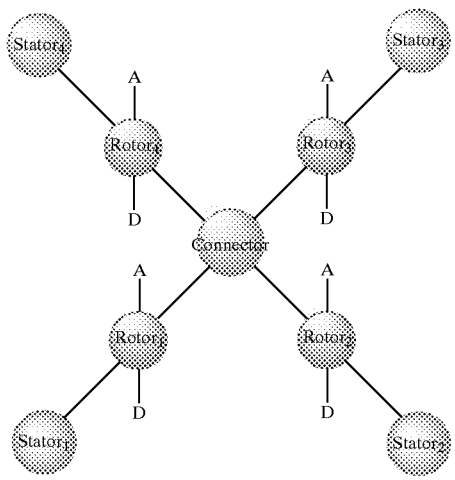

where:
A⁻ is an Acceptor group comprising an electron-withdrawing group selected from the group consisting of: (a) hydrogen, (b) carboxylic acid and its derivatives, (c) sulfuric acid and its derivatives, (d) phosphoric acid and its derivatives, (e) nitro, (f) cyano, (g) hetero atoms selected from the group consisting of N, O, S, P, F, Cl, and Br, (h) functional groups with at least one of said hetero atoms, (i) saturated or unsaturated hydrocarbons, and (j) substituted hydrocarbons;
D⁺ is a Donor group comprising an electron-donating group selected from the group consisting of: (a) hydrogen, (b) amines, (c) OH, (d) SH, (e) ethers, (f) saturated or unsaturated hydrocarbons, (g) substituted hydrocarbons, and (h) functional groups with at least one hetero atom selected from the group consisting of B, Si, I, N, O, S, and P, wherein said Donor group is more electropositive than said Acceptor group;
Rotor₁ and Rotor₂ are independently different geometric rotatable systems that may be exactly the same with identical switch thresholds or different and are conjugating systems selected from substituted single aromatic or polyaromatic hydrocarbons, or conjugated heterocyclic systems, where (1) the aromatic hydrocarbon, or substituted aromatic hydrocarbon, can be either a single ring aromatic or a poly-aromatic and (2) the conjugated heterocyclic system can be either a single ring heterocycle or a fused ring heterocycle; and
Stator₁, Stator₂, Stator₃, Stator₄, and Connector are different geometric fixed conjugating systems selected from the group consisting of: (a) saturated or unsaturated hydrocarbons and (b) substituted hydrocarbons, wherein said hydrocarbon units contain conjugated rings that contribute to an extended conjugation of said molecular system when it is in a planar state (red shifted state), wherein said stators optionally contain at least one bridging group $G_n$, at least one spacing group $R_n$, or both, wherein said at least one bridging group is either (a) selected from the group consisting of acetylene, ethylene, amide, imide, imine, and azo and is used to connect said stators to said rotor or to connect two or more conjugated rings to achieve a desired optical property, electrical property, or both or (b) selected from the group consisting of a single atom bridge and a direct sigma bond between said rotor and said stators and wherein said at least one spacing group is selected from the group consisting of phenyl, isopropyl, and tert-butyl and is used to provide an appropriate 3-dimensional scaffolding to allow molecular systems to pack together while providing space for each rotor to rotate over a desired range of motion.

23. The molecular device of claim 22 having the formula

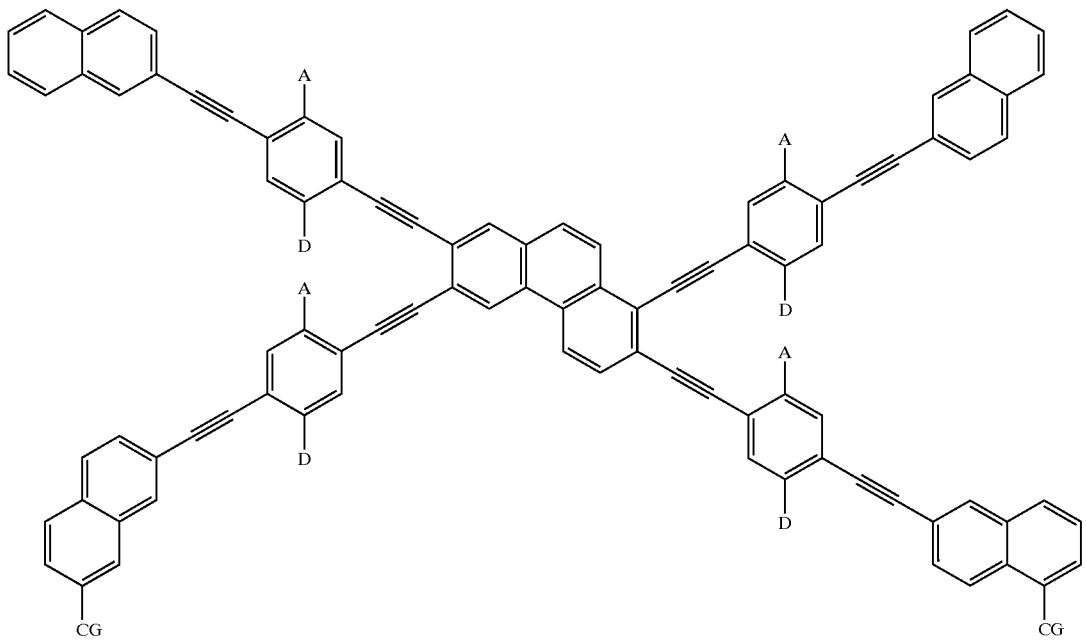

where:
A⁻ is said Acceptor group;
D⁺ is said Donor group; and
CG are said optional connecting units.

24. The molecular device of claim 16 wherein at least some of said rotors have the same dipole moment.

25. The molecular device of claim 24 wherein all said rotors have the same dipole moment.

26. The molecular device of claim 16 wherein all said rotors have different dipole moments from each other.

27. The molecular device of claim 16 wherein each said branch further contains at least one connecting unit at its terminus, said connecting units for connecting said molecular system to other said molecular systems or to substrates.

28. The molecular device of claim 16 wherein each said branch further includes at least one moiety selected from the group consisting of at least one bridging group and at least one spacing group, said at least one bridging group for connecting a stator to a rotor or to connect at least two conjugated rings to achieve a desired effect selected from the group consisting of electrical effects and optical effects and said at least one spacing group for providing a three-dimensional scaffolding to allow said molecular system to pack together with other said molecular systems while providing space for each rotor to rotate over a desired range of motion.

29. The molecular device of claim 16 comprising a crossed-wire device comprising a pair of crossed wires that form a junction where one wire crosses another at an angle other than zero degrees and at least one connector species connecting said pair of crossed wires in said junction, said junction having a functional dimension in nanometers, wherein said at least one connector species comprises said molecular system.

30. The molecular device of claim 29 wherein said crossed-wire device is selected from the group consisting of memories, logic devices, multiplexers, demultiplexers, configurable interconnects for integrated circuits, field-programmable gate arrays (FGPAs), crossbar switches, and communication devices.

31. The molecular device of claim 16 wherein said molecular system is connected to said pair of electrodes by connector units.

32. An electric field-activated optical switch comprising a molecular system configured within an electric field generated by a pair of electrodes, said molecular system having at least three branches with one end of each branch connected to an immobile junction unit, with two of said branches on one side of said junction unit and with at least one other branch on the opposite side of said junction unit wherein:
said molecular system comprises three branches, wherein said two branches each contain an immobile stator unit in its backbone, and said two branches each further contain a rotatable rotor unit in its backbone between said stator unit and said junction unit; or
said molecular system comprises four branches, with two of said branches on one side of said junction unit and with two other said branches on the opposite side thereof wherein each branch contains contain an immobile stator unit in its backbone, and each branch further contain a rotatable rotor unit in its backbone between said stator unit and said junction unit,
wherein each rotor portion rotates with respect to its associated stator portions between at least two different states upon application of said electric field, thereby inducing a band gap change in said molecular system, wherein in a first state, there is extended conjugation over at least most of said molecular system, resulting in a relatively smaller band gap, wherein in a second state, said extended conjugation is changed, resulting in a relatively larger band gap, and-wherein in an intermediate state, said conjugation is intermediate between that of said first state and that of said second state.

33. The optical switch of claim 32 wherein said molecular system comprises three branches, thereby forming a "Y" configuration.

34. The optical switch of claim 33 wherein said third branch contains a third immobile stator unit in its backbone.

35. The optical switch of claim 33 having the general structure

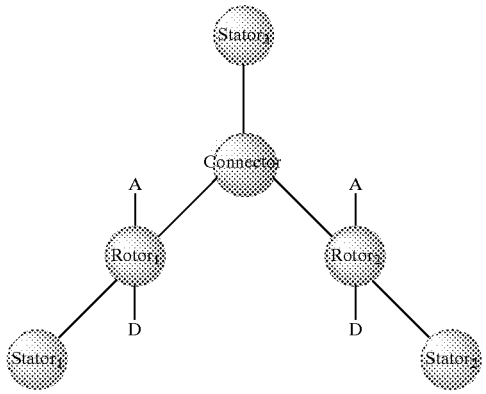

where:
- A⁻ is an Acceptor group comprising an electron-withdrawing group selected from the group consisting of: (a) hydrogen, (b) carboxylic acid and its derivatives, (c) sulfuric acid and its derivatives, (d) phosphoric acid and its derivatives, (e) nitro, (f) cyano, (g) hetero atoms selected from the group consisting of N, O, S, P, F, Cl, and Br, (h) functional groups with at least one of said hetero atoms, (i) saturated or unsaturated hydrocarbons, and (j) substituted hydrocarbons;
- D⁺ is a Donor group comprising an electron-donating group selected from the group consisting of: (a) hydrogen, (b) amines, (c) OH, (d) SH, (e) ethers, (f) saturated or unsaturated hydrocarbons, (g) substituted hydrocarbons, and (h) functional groups with at least one hetero atom selected from the group consisting of B, Si, I, N, O, S, and P, wherein said Donor group is more electropositive than said Acceptor group;
- Rotor₁ and Rotor₂ are independently different geometric rotatable systems that may be exactly the same with identical switch thresholds or different and are conjugating systems selected from substituted single aromatic or polyaromatic hydrocarbons, or conjugated heterocyclic systems, where (1) the aromatic hydrocarbon, or substituted aromatic hydrocarbon, can be either a single ring aromatic or a poly-aromatic and (2) the conjugated heterocyclic system can be either a single ring heterocycle or a fused ring heterocycle; and
- Stator₁, Stator₂, Stator₃, and Connector are different geometric fixed conjugating systems selected from the group consisting of: (a) saturated or unsaturated hydrocarbons and (b) substituted hydrocarbons, wherein said hydrocarbon units contain conjugated rings that contribute to an extended conjugation of said molecular system when it is in a planar state (red shifted state), wherein said stators optionally contain at least one bridging group $G_n$, at least one spacing group $R_n$, or both, wherein said at least one bridging group is either (a) selected from the group consisting of acetylene, ethylene, amide, imide, imine, and azo and is used to connect said stators to said rotor or to connect two or more conjugated rings to achieve a desired optical property, electrical property, or both or (b) selected from the group consisting of a single atom bridge and a direct sigma bond between said rotor and said stators and wherein said at least one spacing group is selected from the group consisting of phenyl, isopropyl, and tert-butyl and is used to provide an appropriate 3-dimensional scaffolding to allow molecular systems to pack together while providing space for each rotor to rotate over a desired range of motion.

36. The optical switch of claim 35 having the formula

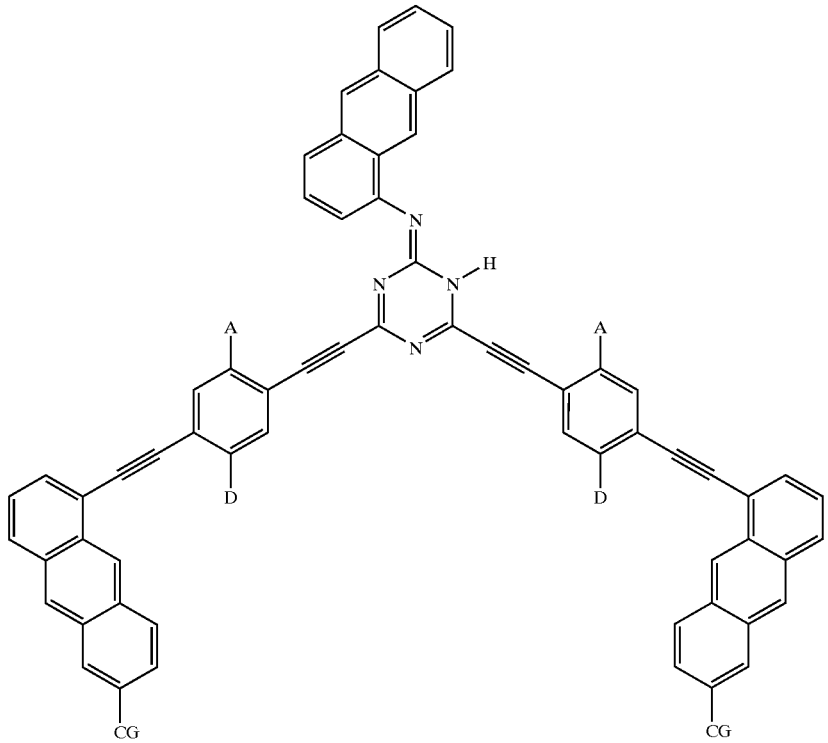

where:
- A⁻ is said Acceptor group;
- D⁺ is said Donor group; and
- CG are said optional connecting units.

37. The optical switch of claim 32 wherein said molecular system comprises four branches, thereby forming an "X" configuration.

38. The optical switch of claim 37 having the general structure

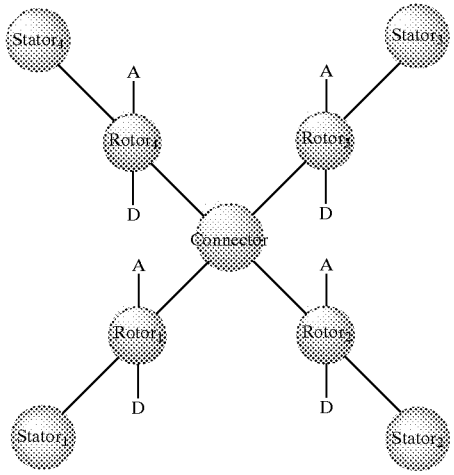

where:
- A⁻ is an Acceptor group comprising an electron-withdrawing group selected from the group consisting of: (a) hydrogen, (b) carboxylic acid and its derivatives, (c) sulfuric acid and its derivatives, (d) phosphoric acid and its derivatives, (e) nitro, (f) cyano, (g) hetero atoms selected from the group consisting of N, O, S, P, F, Cl, and Br, (h) functional groups with at least one of said hetero atoms, (i) saturated or unsaturated hydrocarbons, and (j) substituted hydrocarbons;
- D⁺ is a Donor group comprising an electron-donating group selected from the group consisting of: (a) hydrogen, (b) amines, (c) OH, (d) SH, (e) ethers, (f) saturated or unsaturated hydrocarbons, (g) substituted hydrocarbons, and (h) functional groups with at least one hetero atom selected from the group consisting of B, Si, I, N, O, S, and P, wherein said Donor group is more electropositive than said Acceptor group;
- Rotor₁ and Rotor₂ are independently different geometric rotatable systems that may be exactly the same with identical switch thresholds or different and are conjugating systems selected from substituted single aromatic or polyaromatic hydrocarbons, or conjugated heterocyclic systems, where (1) the aromatic hydrocarbon, or substituted aromatic hydrocarbon, can be either a single ring aromatic or a poly-aromatic and (2) the conjugated heterocyclic system can be either a single ring heterocycle or a fused ring heterocycle; and
- Stator₁, Stator₂, Stator₃, Stator₄, and Connector are different geometric fixed conjugating systems selected from the group consisting of: (a) saturated or unsaturated hydrocarbons and (b) substituted hydrocarbons, wherein said hydrocarbon units contain conjugated rings that contribute to an extended conjugation of said molecular system when it is in a planar state (red shifted state), wherein said stators optionally contain at least one bridging group $G_n$, at least one spacing group $R_n$, or both, wherein said at least one bridging group is either (a) selected from the group consisting of acetylene, ethylene, amide, imide, imine, and azo and is used to connect said stators to said rotor or to connect two or more conjugated rings to achieve a desired optical property, electrical property, or both or (b) selected from the group consisting of a single atom bridge and a direct sigma bond between said rotor and said stators and wherein said at least one spacing group is selected from the group consisting of phenyl, isopropyl, and tert-butyl and is used to provide an appropriate 3-dimensional scaffolding to allow molecular systems to pack together while providing space for each rotor to rotate over a desired range of motion.

39. The optical switch of claim 38 having the formula

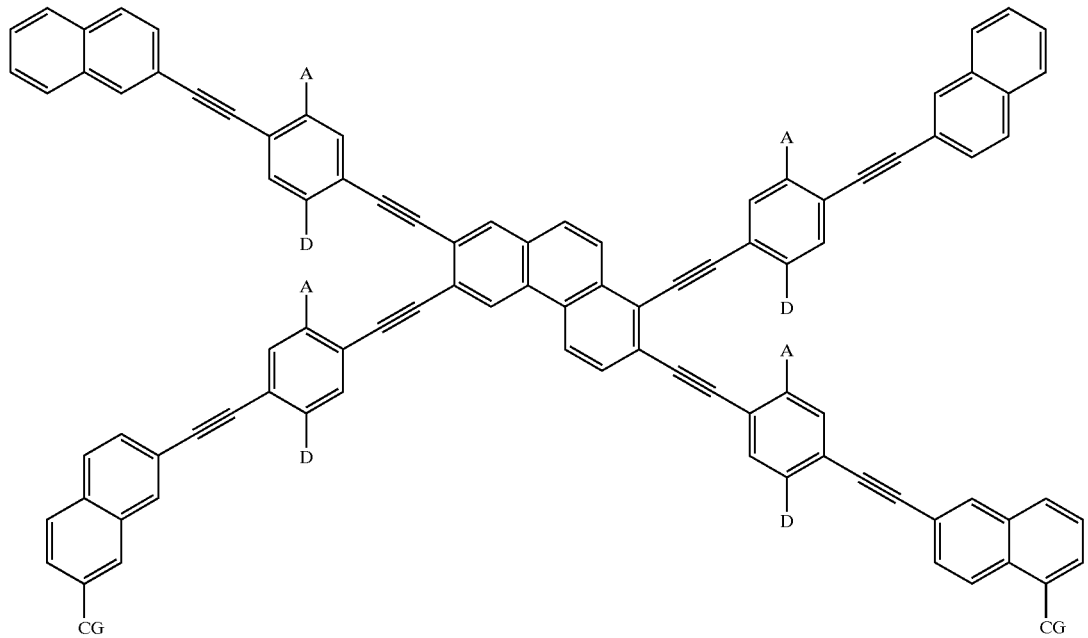

where:

A⁻ is said Acceptor group;

D⁺ is said Donor group; and

CG are said optional connecting units.

40. The optical switch of claim 32 wherein at least some of said rotors have the same dipole moment.

41. The optical switch of claim 40 wherein all said rotors have the same dipole moment.

42. The optical switch of claim 32 wherein all said rotors have different dipole moments from each other.

43. The optical switch of claim 32 wherein each said branch further contain connecting units at its terminus, said connecting units for connecting said molecular system to other said molecular systems or to substrates.

44. The optical switch of claim 32 wherein each said branch further includes at least one moiety selected from the group consisting of at least one bridging group and at least one spacing group, said at least one bridging group for connecting a stator to a rotor or to connect at least two conjugated rings to achieve a desired effect selected from the group consisting of electrical effects and optical effects and said at least one spacing group for providing a three-dimensional scaffolding to allow said molecular system to pack together with other said molecular systems while providing space for each rotor to rotate over a desired range of motion.

45. The optical switch of claim 32 wherein said molecular system is suspended between two electrodes such that said two branches are each electrically associated with a first electrode and wherein said at least one other branch is electrically associated with a second electrode, to which said externally-applied electric field is connected, thereby forming said optical switch.

46. The optical switch of claim 32 wherein said molecular system is bi-stable, which provides a non-volatile component.

47. The optical switch of claim 32 wherein said molecular system has essentially a low activation barrier between different states to provide a fast, but volatile, switch.

48. The optical switch of claim 32 wherein said molecular system has more than two switchable states, such that optical properties of said molecular system can be tuned by either continuously by application of a decreasing or increasing electric field to form a volatile switch or the color is changed abruptly by the application of voltage pulses to a switch with at least one activation barrier.

49. The optical switch of claim 32 wherein said molecular system changes between a transparent state and at least one colored state.

50. The optical switch of claim 32 wherein said molecular system changes between one colored state and at least one other colored state.

51. The optical switch of claim 32 wherein said molecular system changes between one index of refraction and at least one other index of refraction.

* * * * *